(12) United States Patent
Wu et al.

(10) Patent No.: US 10,861,366 B2
(45) Date of Patent: Dec. 8, 2020

(54) DISPLAY PANEL AND DISPLAY DEVICE HAVING DIFFERENT DISPLAY AREAS

(71) Applicant: WUHAN TIANMA MICRO-ELECTRONICS CO., LTD.

(72) Inventors: Kerong Wu, Xiamen (CN); Yong Yuan, Shanghai (CN); Hongming Chen, Xiamen (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 80 days.

(21) Appl. No.: 16/100,626

(22) Filed: Aug. 10, 2018

(65) Prior Publication Data

US 2019/0130807 A1    May 2, 2019

(30) Foreign Application Priority Data

Oct. 31, 2017    (CN) .......................... 2017 1 1043163

(51) Int. Cl.
     *G09G 3/20*      (2006.01)
     *G09G 3/3266*      (2016.01)
     (Continued)

(52) U.S. Cl.
CPC .............. *G09G 3/20* (2013.01); *G09G 3/3266* (2013.01); *G09G 3/3674* (2013.01); *G11C 19/28* (2013.01); *G11C 19/287* (2013.01); *G09G 2300/0439* (2013.01); *G09G 2310/0267* (2013.01); *G09G 2310/0281* (2013.01); *G09G 2310/0286* (2013.01); *G09G 2310/08* (2013.01)

(58) Field of Classification Search
CPC .............................................. G09G 2310/0286
See application file for complete search history.

(56) References Cited

U.S. PATENT DOCUMENTS 7,027,013 B2 *   4/2006   Ouellete .................. G09G 3/20
                                                                     345/36
7,692,619 B2 *   4/2010   Shin ...................... G09G 3/3266
                                                                     345/100

(Continued)

FOREIGN PATENT DOCUMENTS

CN           1753072 A      3/2006
CN         101295081 A     10/2008
(Continued)

*Primary Examiner* — Chad M Dicke
(74) *Attorney, Agent, or Firm* — Anova Law Group PLLC

(57) ABSTRACT

A display panel includes a plurality of scan lines and a scan driving circuit for driving the plurality of scan lines, where each of the plurality of scan lines extending in a first direction and sequentially aligned in a second direction, and the first direction intersects with the second direction; the scan driving circuit includes a first scan driving sub-circuit, a second scan driving sub-circuit, and a third scan driving sub-circuit, and the first scan driving sub-circuit is cascaded with the second scan driving sub-circuit; and the display panel includes a first area and a second area adjacent to each other in the second direction, the first scan driving sub-circuit drives scan lines in the first area in a progressive scan mode, and the second scan driving sub-circuit and the third scan driving sub-circuit respectively drive scan lines in the second area in an interlaced scan mode.

9 Claims, 22 Drawing Sheets

(51) Int. Cl.
*G09G 3/36* (2006.01)
*G11C 19/28* (2006.01)

(56) References Cited

U.S. PATENT DOCUMENTS

| | | | | | |
|---|---|---|---|---|---|
| 8,077,168 | B2* | 12/2011 | Shin | | G09G 3/3266 |
| | | | | | 345/204 |
| 8,228,283 | B2* | 7/2012 | Kitayama | | G09G 3/3648 |
| | | | | | 345/100 |
| 9,767,747 | B2* | 9/2017 | Oh | | G09G 5/006 |
| 9,774,846 | B2* | 9/2017 | Kim | | G09G 3/003 |
| 10,121,443 | B2* | 11/2018 | Konoshita | | G09G 3/3677 |
| 10,170,060 | B2* | 1/2019 | Tseng | | G06F 1/163 |
| 2006/0156118 | A1* | 7/2006 | Shin | | G09G 3/20 |
| | | | | | 714/726 |
| 2008/0278467 | A1* | 11/2008 | Hwang | | G09G 3/3677 |
| | | | | | 345/205 |
| 2013/0155124 | A1* | 6/2013 | Tsuge | | G09G 3/3266 |
| | | | | | 345/690 |
| 2015/0310827 | A1* | 10/2015 | Song | | G09G 3/2022 |
| | | | | | 345/690 |
| 2016/0182042 | A1* | 6/2016 | Kim | | G09G 3/2092 |
| | | | | | 345/213 |
| 2017/0249896 | A1* | 8/2017 | Kim | | H01L 27/124 |
| 2017/0287424 | A1* | 10/2017 | Wu | | G11C 19/184 |
| 2017/0301280 | A1* | 10/2017 | Ka | | G09G 3/3406 |
| 2018/0190190 | A1* | 7/2018 | Xi | | G09G 3/3225 |
| 2018/0190232 | A1* | 7/2018 | Xue | | G09G 3/3677 |
| 2019/0073932 | A1* | 3/2019 | Huang | | G09G 3/3266 |
| 2019/0147821 | A1* | 5/2019 | Tagawa | | G11C 19/28 |
| | | | | | 345/173 |

FOREIGN PATENT DOCUMENTS

| | | |
|---|---|---|
| CN | 101779227 A | 7/2010 |
| CN | 105139797 A | 12/2015 |
| CN | 107123388 A | 9/2017 |

* cited by examiner

DISPLAY PANEL AND DISPLAY DEVICE HAVING DIFFERENT DISPLAY AREAS

CROSS-REFERENCES TO RELATED APPLICATIONS

This application claims the priority of Chinese Patent Application No. 201711043163.8, filed on Oct. 31, 2017, the entire content of which is incorporated herein by reference.

FIELD OF THE DISCLOSURE

The present disclosure generally relates to the field of display technology and, more particularly, relates to a display panel and a display device thereof.

BACKGROUND

At present, due to the demand for higher screen ratio on the display devices from users, some display devices use special-shaped display panels for a display screen. For a special-shaped display panel, generally, a part is removed by cutting at the top, bottom, or middle of the display panel. Other accessories, such as a headset jack, a camera lens, etc., are disposed in the space created from the cut area of a display device, to achieve an increased display area on the display device.

In one type of the special-shaped display panels, a part of a frame is curved, and the space of the curved region is usually small. To achieve a scan driving mode of interlaced scanning, a scan driving circuit needs to be disposed at the curved region of the frame, which poses a problem for wiring design at the curved position of the frame, and thus does not facilitate achieving narrow bezels. In another situation, as shown in FIG. 1, the top of a display panel is cut into two parts to form a left special-shaped area P1 and a right special-shaped area P2. In the existing designs, in order to achieve a scan driving mode of interlaced scanning (that is, the L1 line of the left special-shaped area and the L1 line of the right special-shaped area are scanned together, and the R2 line of the left special-shaped area and the R2 line of the right special-shaped area are initialized to scan at the same time), the scan driving circuit VSRZ on the left side needs to bypass the upper part of the left special-shaped area P1 to reach the left side of the right special-shaped area P2, and the scan driving circuit VSRY on the right side needs to bypass the upper part of the right special-shaped area P2 to reach the right side of the left special-shaped area P1. This also increases the complexity of wiring at the borders of the special-shaped areas, and thus does not facilitate achieving narrow bezels.

BRIEF SUMMARY OF THE DISCLOSURE

In view of the above, the present disclosure provides a display panel and a display device thereof, to solve the problems including the complexity of wiring of scan driving circuits in the special-shaped panels that may hinder achieving narrow bezels.

To solve the above problems, in one aspect, the present disclosure provides a display panel. The display panel includes a first area and a second area; a plurality of scan lines disposed in the first area and the second area; and a scan driving circuit for driving the plurality of scan lines, where: each of the plurality of scan lines extends in a first direction and is sequentially aligned in a second direction, and the first direction intersects with the second direction, the scan driving circuit includes a first scan driving sub-circuit, a second scan driving sub-circuit, and a third scan driving sub-circuit, and the first scan driving sub-circuit is cascaded with the second scan driving sub-circuit, and the first area and the second area are adjacent to each other in the second direction, the first scan driving sub-circuit drives scan lines in the first area in a progressive scan mode, and the second scan driving sub-circuit and the third scan driving sub-circuit respectively drive scan lines in the second area in an interlaced scan mode.

In another aspect, the present disclosure further provides a display device. The display device includes a signal-generating component for generating a signal; and a display panel for displaying the signal, where the display panel includes: a first area and a second area; a plurality of scan lines disposed in the first area and the second area; and a scan driving circuit for driving the plurality of scan lines, where: each of the plurality of scan lines extends in a first direction and is sequentially aligned in a second direction, and the first direction intersects with the second direction, the scan driving circuit includes a first scan driving sub-circuit, a second scan driving sub-circuit, and a third scan driving sub-circuit, and the first scan driving sub-circuit is cascaded with the second scan driving sub-circuit, and the first area and the second area are adjacent to each other in the second direction, the first scan driving sub-circuit drives scan lines in the first area in a progressive scan mode, and the second scan driving sub-circuit and the third scan driving sub-circuit respectively drive scan lines in the second area in an interlaced scan mode.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
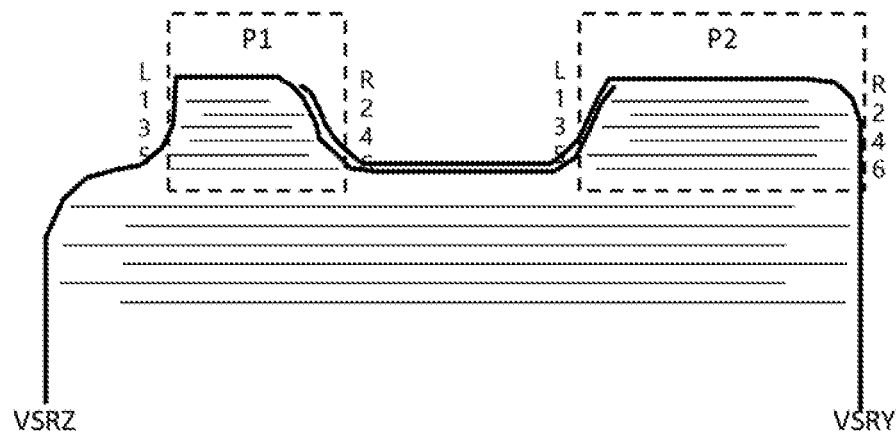
FIG. 1 illustrates a schematic structural diagram of a display panel in accordance with the existing technology.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

The embodiments of the present disclosure provide a display panel. The display panel includes a scan driving circuit and a plurality of scan lines. Each of the plurality of scan lines extends in a first direction and sequentially aligned in a second direction, where the first direction intersects with the second direction. The scan driving circuit is configured to drive the plurality of scan lines, and includes at least three scan driving sub-circuits, that is, a first scan driving sub-circuit, a second scan driving sub-circuit, and a third scan driving sub-circuit. Here, the first scan driving sub-circuit is cascaded with the second scan driving sub-circuit.

The display panel has a first area and a second area adjacent to each other in the second direction. The first scan driving sub-circuit drives the scan lines in the first area in a progressive scan mode. The second scan driving sub-circuit and the third scan driving sub-circuit respectively drive the scan lines in the second area in an interlaced scan mode. That is, when the first area is a special-shaped area, the first area is scanned in a progressive scan mode, while as a normal area, the second area is still scanned in an interlaced scan mode.

For a special-shaped area, the first scan driving sub-circuit is set on one side of the frame. For a display panel having a non-arc frame in the special-shaped area, one may select to dispose a driving sub-circuit only on the non-arc frame of the special-shaped area, but not on the arc frame. For a display panel with arc frames on both sides of the special-shaped area, there is no requirement to dispose a scan driving circuit on both sides. For a display panel including multiple special-shaped areas, there is no requirement to set connection lines between the scan driving circuits in the different special-shaped areas. For the major area of a display panel, that is, the normal area, it may still be driven by an interlaced scan mode. Compared with the wiring modes of the scan driving circuits for the special-shaped display panels in the existing technology, the wiring mode in the present disclosure is simplified, thereby facilitating the achievement of narrow bezels.

Apparently, the present disclosure is not limited to the special-shaped display panels. Depending on actual needs, the present disclosure may also be applied to a standard display panel, such as a rectangular or rounded rectangular display panel. The present disclosure is provided by way of instruction but not by way of limitation of the actual shapes of the panels that can be applied.

A more detailed and comprehensive description of the technical solutions of the disclosed embodiments will be made hereinafter by reference to the accompanying drawings of the embodiments of the present disclosure.

Figure 2:
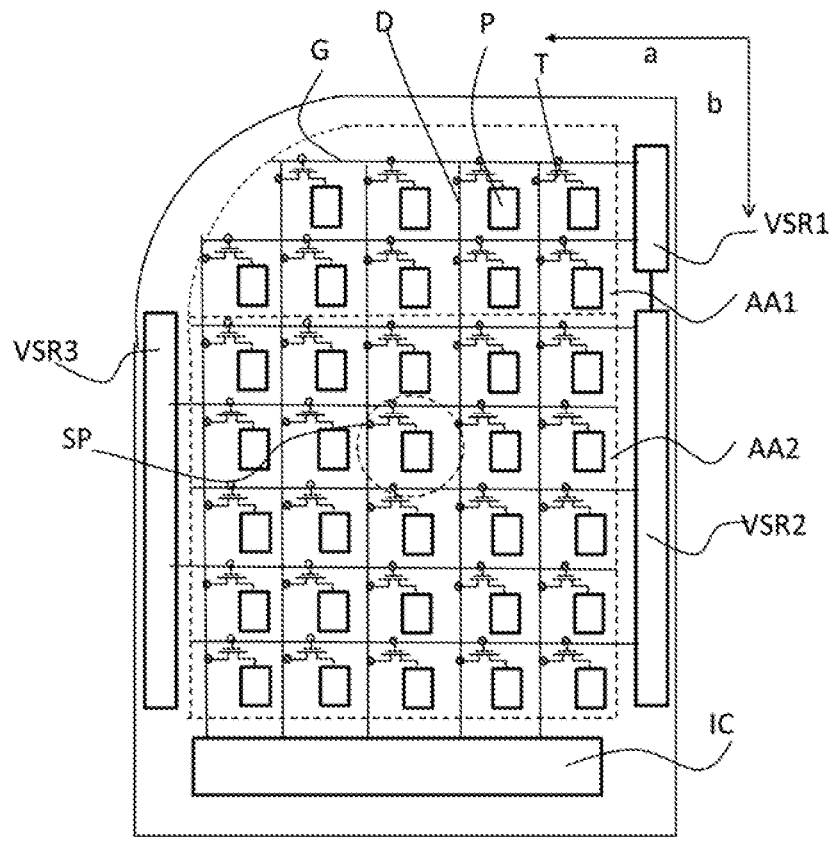
FIG. 2 illustrates a schematic structural diagram of a display panel consistent with disclosed embodiments.

FIG. 2 illustrates a schematic structural diagram of a display panel consistent with disclosed embodiments. As shown in FIG. 2, the display panel has a first area AA1 and a second area AA2 aligned adjacent to each other in the second direction b.

The display panel includes a plurality of scan lines G, each of which extends in the first direction a and sequentially aligned in the second direction b. The first direction a intersects with the second direction b.

The display panel further includes a scan driving circuit for driving the scan lines G. In some embodiments, as shown in FIG. 2, the display panel further includes a plurality of sub-pixels SP aligned in an array format, a plurality of data lines D, and an integrated circuit chip IC. Each sub-pixel SP includes a pixel electrode P and a thin film transistor T. The scan lines G are respectively connected to the control terminals of the thin film transistors T and the scan driving circuit. The data lines D are respectively connected to the first terminals of the thin film transistors T and the integrated circuit chip IC. The second terminals of the thin film transistors T are connected to the pixel electrodes P. The integrated circuit chip IC is configured to apply a pixel voltage to pixel electrodes P. Through the scan lines G, the scan driving circuit controls the thin film transistors T of each row of sub-pixels SP to be turned on. The integrated circuit chip IC applies a pixel voltage through the data lines D to the first terminals of thin film transistors T, which then reaches the pixel electrodes P via the second terminals of the thin film transistors T to lighten the sub-pixels SP and accomplish the display.

Still referring to FIG. 2, the scan driving circuit of the display panel provided by the disclosed embodiments includes three scan driving sub-circuits. The three scan driving sub-circuits are the first scan driving sub-circuit VSR1, the second scan driving sub-circuit VSR2, and the third scan driving sub-circuit VSR3. Here, the first scan driving sub-circuit VSR1 and the second scan driving sub-circuit VSR2 are disposed on a frame on the same side of the display panel. The third scan driving sub-circuit VSR3 is disposed on a frame on another side of the display panel, and is disposed on the opposite side of the first scan driving sub-circuit VSR1 and the second scan driving sub-circuit VSR2 in the display panel. In the illustrated embodiment shown in FIG. 2, the first scan driving sub-circuit VSR1 and the second scan driving sub-circuit VSR2 are disposed both on the right side-frame of the display panel. Specifically, the first scan driving sub-circuit VSR1 is disposed on the frame on the right side of the first area AA1, the second scan driving sub-circuit VSR2 is disposed on the frame on the right side of the second area AA2, while the third scan driving sub-circuit VSR3 is disposed on the frame on the left side of the second area AA2. The first scan driving sub-circuit VSR1 is cascaded with the second scan driving sub-circuit VSR2.

During one implementation of the scan driving circuit, the first scan driving sub-circuit VSR1 first drives the scan lines G in the first area AA1 in a progressive scan mode, then the second scan driving sub-circuit VSR2 and the third scan driving sub-circuit VSR 3 drive the scan lines G in the second area AA2 in an interlaced scan mode. For example, the first scan driving sub-circuit VSR1 drives the first to x−1-th scan lines in the display panel, the second scan driving sub-circuit VSR2 drives the x+2m-th scan lines of the display panel, and the third scan driving sub-circuit VSR3 drives the x+2m+1-th scan lines of the display panel, where x is an integer greater than 2, and m is an integer greater than or equal to 0. Through the first scan driving sub-circuit VSR1, the second scan driving sub-circuit VSR2, and the third scan driving sub-circuit VSR3, all of the scan lines G in a display panel may be scanned in a scan cycle.

Taking the display panel in FIG. 2 as an example, the first scan driving sub-circuit VSR1 drives the first and second scan lines in the display panel, the second scan driving sub-circuit VSR2 drives the third, fifth, and seventh scan lines in the display panel, and the third scan driving sub-circuit VSR3 drives the fourth and sixth scan lines in the display panel. Through the first scan driving sub-circuit VSR1, the second scan driving sub-circuit VSR2, and the third scan driving sub-circuit VSR3, the scanning of the first to the seventh scan lines in the display panel is accomplished in a scan cycle. The thin film transistors T in the sub-pixels SP of the first to the seventh rows are sequentially turned on row by row.

In the disclosed embodiments, the first area is a special-shaped area. The first scan driving sub-circuit only needs to be disposed on one side of the first area, and there is no need to dispose a scan driving circuit on both sides of the first area. For the major area of the display panel, that is, the normal second area, it may still be driven by an interlaced scan mode. Compared with the wiring modes of the scan driving circuits for the special-shaped display panels in the existing technology, the wiring mode in the disclosed embodiments is simplified, thereby facilitating the achievement of narrow bezels.

Figure 3:
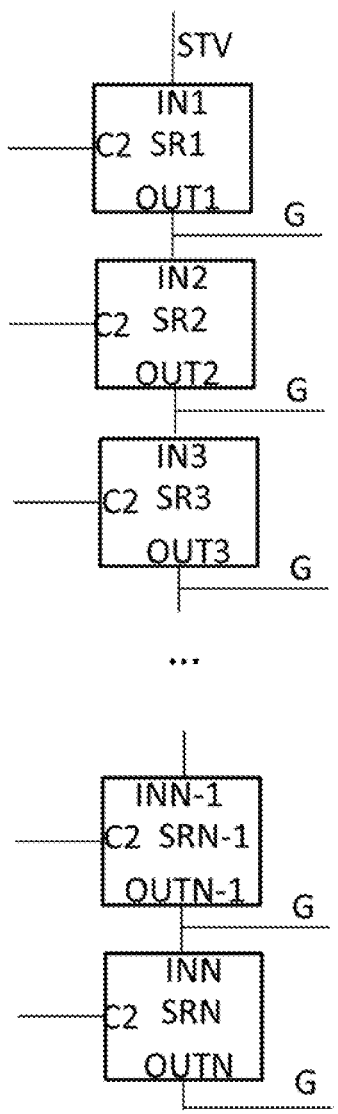
FIG. 3 illustrates a schematic diagram of a scan driving sub-circuit of a display panel consistent with disclosed embodiments.

FIG. 3 illustrates a schematic diagram of a scan driving sub-circuit of a display panel consistent with disclosed embodiments. In some embodiments, as shown in FIG. 3, a scan driving sub-circuit includes a plurality of successively cascaded shift registers SRn. Each shift register SRn includes an input terminal INn, an output terminal OUTn, and an output signal control terminal C2, where the output terminal OUTn is connected to a scan line G. Here, n is an integer greater than or equal to 1.

For a specific scan driving sub-circuit, if the first stage shift register SR1 of the scan driving sub-circuit is connected to the first scan line of the display panel, the input terminal IN1 of the first stage shift register SR1 receives the start pulse signal STV of the display panel. Otherwise, according to the order of the scanning, the input terminal IN1 of the first stage shift register SR1 of a scan driving sub-circuit is connected to the output terminal of a shift register in a preceding scan driving sub-circuit. That is, the signal outputted from the output terminal of a shift register of a preceding scan driving sub-circuit is taken as the start pulse signal STV of the present scan driving sub-circuit. For the second stage shift register SR2 to the N-th stage shift register SRN in each scan driving sub-circuit, the input terminal INx of each stage shift register SRx is connected to the output terminal OUTx−1 of a preceding stage shift register SRx−1, to achieve the cascade of shift registers in the same scan driving sub-circuit. Here, N and x are integers greater than or equal to two.

Figure 4:
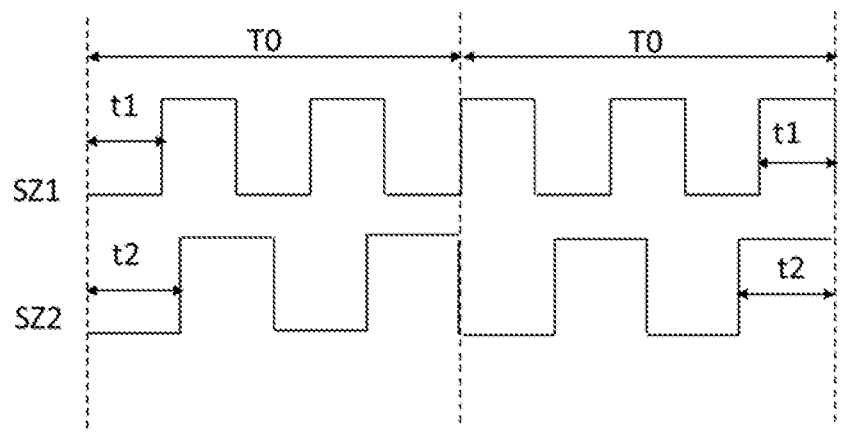
FIG. 4 illustrates a schematic diagram of clock cycles and moments of a display panel consistent with disclosed embodiments.

In the scan driving circuit, the signals input or outputted by the shift registers are all clock signals. By controlling the frequency of the input clock signals, the number of moments in a time unit may be controlled. FIG. 4 illustrates a schematic diagram of clock cycles and moments of a display panel consistent with the disclosed embodiments. As shown in FIG. 4, the length of a time unit is T0, the frequency of the first clock signal SZ1 is greater than the frequency of the second clock signal SZ2. The first clock signal SZ1 includes a total of five moments t1 in a time unit. The second clock signal SZ2 includes a total of four moments t2 in a time unit.

In a shift register SRn, after the input terminal INn receives an active-level signal, the timing at which the output terminal OUTn outputs an active-level signal is synchronized with the timing at which the output signal control terminal C2 receives a first active-level signal. That is, after the input terminal INn receives an active-level signal, at the timing that the output signal control terminal C2 receives a first active-level signal, the output terminal OUTn outputs an active-level signal. Through controlling the timing at which the output signal control terminal C2 receives an active-level signal, the relationship between the timing at which the output terminal OUTn outputs an active-level signal and the timing at which the input terminal INn receives an active-level signal may be controlled.

Figure 5:
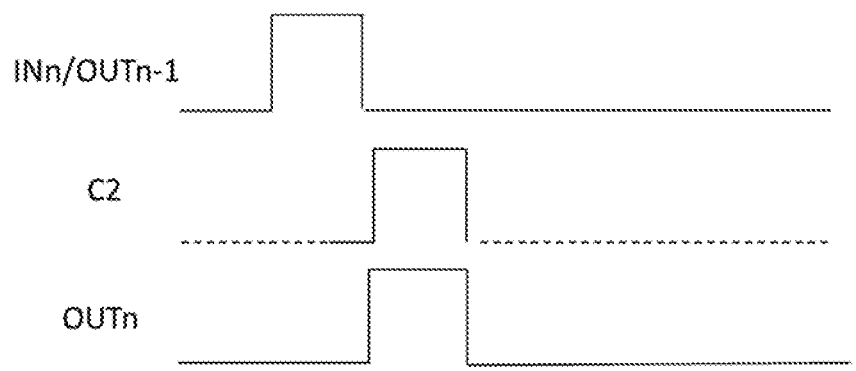
FIG. 5 illustrates a timing diagram of a shift register in a first scan driving sub-circuit of a display panel consistent with disclosed embodiments.

FIG. 5 illustrates a timing diagram of a shift register in a first scan driving sub-circuit of a display panel consistent with disclosed embodiments. For a shift register in the first scan driving sub-circuit that implements a progressive scan mode, as shown in FIG. 5, at a moment following the receipt of an active-level signal by the input terminal INn, the output signal control terminal C2 is input with a first active-level signal. This allows the output terminal OUTn outputs an active-level signal one moment later than that the input terminal INn receives an active-level signal. That is, there is a one-moment difference between the timing at which the output terminal OUTn receives an active-level signal and the timing at which the input terminal INn receives an active-level signal. In other words, the timing at which the output terminal OUTn outputs an active-level signal is one moment later than the timing at which the output terminal OUTn−1 outputs an active-level signal, thereby achieving a progressive scanning.

Figure 6:
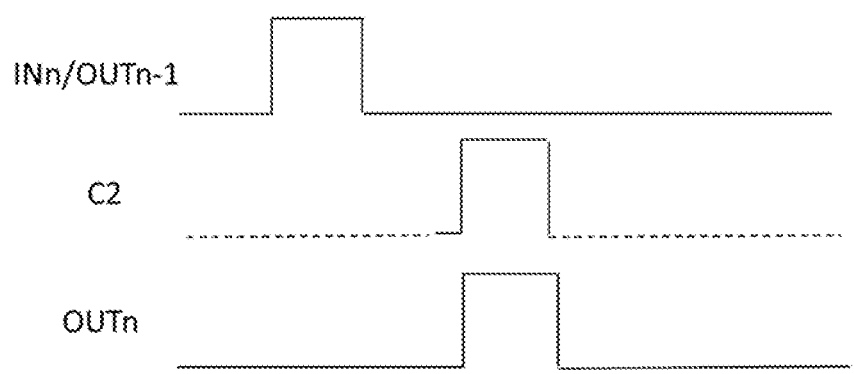
FIG. 6 illustrates a timing diagram of a shift register in a second scan driving sub-circuit and a third scan driving sub-circuit of a display panel consistent with disclosed embodiments.

FIG. 6 illustrates a timing diagram of a shift register in a second scan driving sub-circuit and a third scan driving sub-circuit of a display panel consistent with disclosed embodiments. For a shift register in the second scan driving sub-circuit and the third scan driving sub-circuit in an interlaced scan mode, as shown in FIG. 6, two moments after the input terminal INn receives an active-level signal, the output signal control terminal C2 is input with a first active-level signal, so that the timing at which the output terminal OUTn outputs an active-level signal is two-moment later than the timing at which the input terminal INn receives an active-level signal. That is, there is a two-moment difference between the timing at which the output signal control terminal C2 receives an active-level signal and the timing at which the input terminal INn receives an active-level signal.

In other words, the timing at which the output terminal OUTn outputs an active-level signal is two-moment later than the timing at which the output terminal OUTn−1 outputs an active-level signal. This allows the second scan driving sub-circuit and the third scan driving sub-circuit to respectively perform an interlaced scanning. There is a one-moment difference between the timings at which the output signal control terminals C2 that control the same stage of shift registers SRn in the second scan driving sub-circuit and the third scan driving sub-circuit to receive an active-level signal. This then controls the output terminals OUTn that control the same stage of shift registers SRn in the second scan driving sub-circuit and the third scan driving sub-circuit to output an active-level signal with a one-moment difference, and thus allows the same stage of shift registers SRn in the second scan driving sub-circuit and the third scan driving sub-circuit to scan adjacent rows.

In the disclosed embodiments, by controlling the timing of an active-level signal on the output signal control terminal of each shift register, the timing of an active-level signal on the output terminal of each shift register may be controlled. This allows the first scan driving sub-circuit to drive the scan lines in the first area in a progressive scan mode, and the second scan driving sub-circuit and the third scan driving sub-circuit to drive the scan lines of the second area in an interlaced scan mode.

Figure 7:
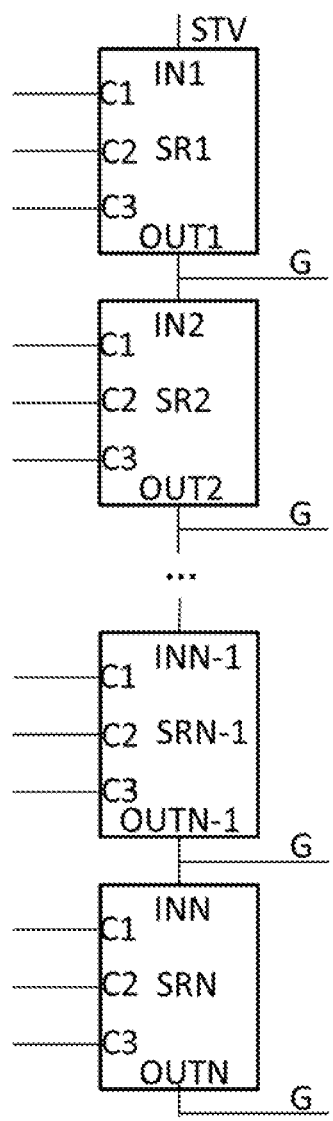
FIG. 7 illustrates a schematic diagram of a shift register of a display panel consistent with disclosed embodiments.

FIG. 7 illustrates a schematic diagram of a shift register of a display panel consistent with disclosed embodiments. In some embodiments, as shown in FIG. 7, a shift register SRn includes a start signal input terminal C1, an output signal control terminal C2, a reset signal input terminal C3, an input terminal INn, and an output terminal OUTn. The start signal input terminal C1, the output signal control terminal C2, and the reset signal input terminal C3 all have clock signals.

Figure 8:
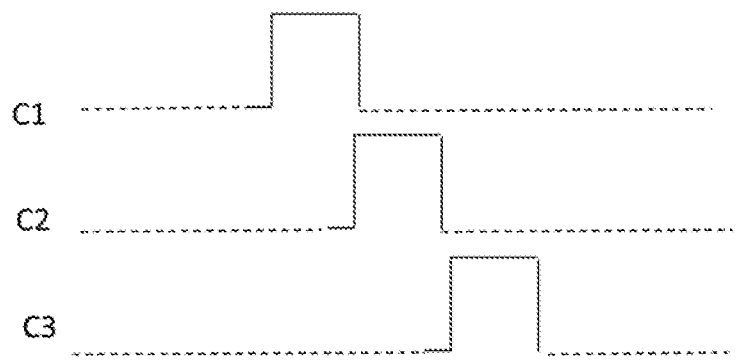
FIG. 8 illustrates a timing diagram of clock signals of a shift register in a first scan driving sub-circuit of a display panel consistent with disclosed embodiments.

FIG. 8 illustrates a timing diagram of a clock signal of a shift register in a first scan driving sub-circuit of a display panel consistent with disclosed embodiments. For the first scan driving sub-circuit, in a specific shift register, the start signal input terminal of C1, the output signal control terminal C2, and the reset signal input terminal C3 successively receive an active-level signal with a one-moment difference (e.g., one time-period or one clock-cycle/sub-clock-cycle). That is, for a shift register in the first scan driving sub-circuit, at the first moment, the start signal input terminal C1 receives an active-level signal, and the shift register is in a state in which its output terminal can output an active-level signal. At the second moment, when the output signal control terminal C2 receives an active-level signal, the output terminal of the shift register outputs an active-level signal. At the third moment, the reset signal input terminal C3 receives an active-level signal, and the shift register ends the state in which it can output an active-level signal. Before the next start signal input terminal C1 arrives, the shift register is in a state in which it cannot output an active-level signal. Through the start signal input terminal C1, the shift register is in a state in which its output terminal can output an active-level signal. After the third moment, the output terminal of the shift register outputs an active-level signal. In the next moment, through the resetting of the state by the reset signal input terminal C3, the output terminal of the shift register no longer outputs an active-level signal.

Figure 9:
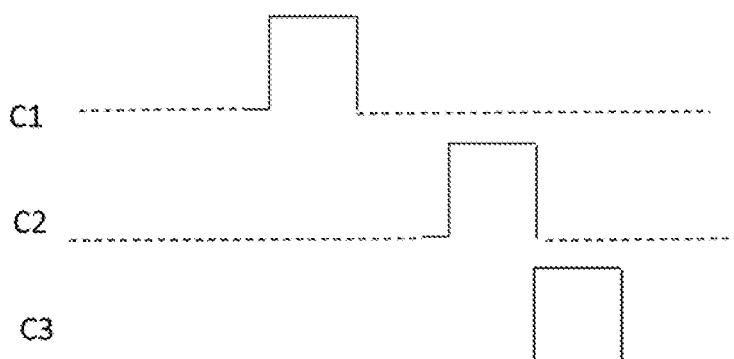
FIG. 9 illustrates a timing diagram of clock signals of a shift register in a second scan driving sub-circuit and a third scan driving sub-circuit of a display panel consistent with disclosed embodiments.

FIG. 9 illustrates a timing diagram of a clock signal of a shift register in a second scan driving sub-circuit and a third scan driving sub-circuit of a display panel consistent with disclosed embodiments. For the second scan driving sub-circuit and the third scan driving sub-circuit, in a specific shift register, there is a two-moment difference between the timing at which the start signal input terminal C1 and the output signal control terminal C2 receive an active-level signal, and there is a one-moment difference between the timing at which the output signal control terminal C2 and the reset signal input terminal C3 receive an active-level signal. That is, for a shift register in the second scan driving sub-circuit and the third scan driving sub-circuit, at the first moment, the start signal input terminal C1 receives an active-level signal, and the shift register is in a state in which its output terminal can output an active-level signal.

At the third moment, when the output signal control terminal C2 receives an active-level signal, the output terminal of the shift register outputs an active-level signal. At the fourth moment, the reset signal input terminal C3 receives an active-level signal, and the shift register ends the state in which it can output an active-level signal. Before the next start signal input terminal C1 arrives, the shift register is in a state in which it cannot output an active-level signal. Through the start signal input terminal C1, the shift register is in a state in which its output terminal can output an active-level signal. After two moments, the output terminal of the shift register outputs an active-level signal. In the next, through the resetting of the state by the reset signal input terminal C3, the output terminal of the shift register no longer outputs an active-level signal.

Figure 10:
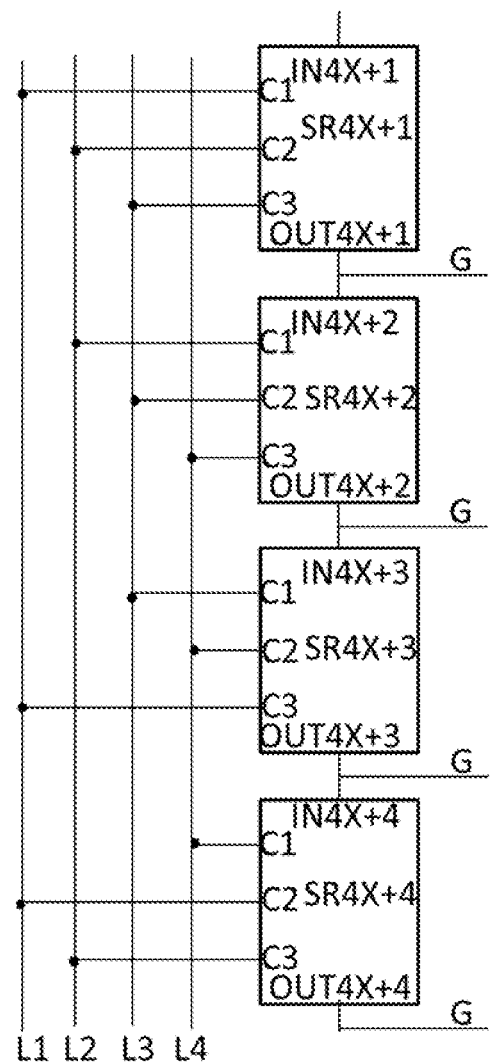
FIG. 10 illustrates a schematic diagram of a first scan driving sub-circuit of a display panel consistent with disclosed embodiments.
Figure 11:
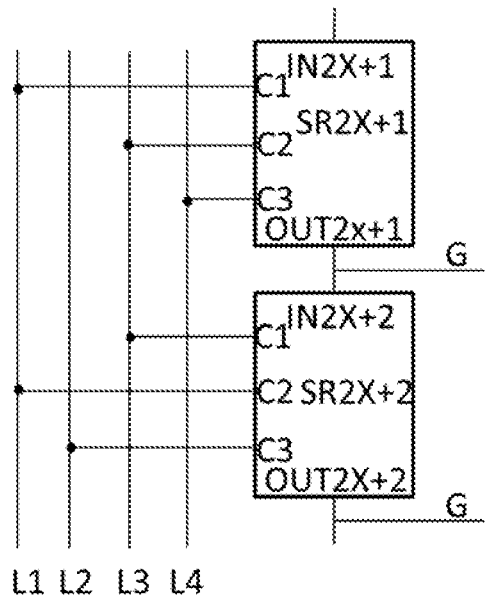
FIG. 11 illustrates a schematic diagram of a second scan driving sub-circuit of a display panel consistent with disclosed embodiments.
Figure 12:
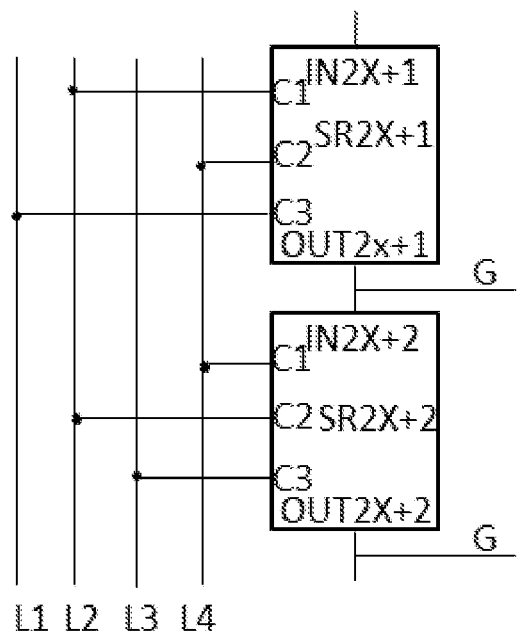
FIG. 12 illustrates a schematic diagram of a third scan driving sub-circuit of a display panel consistent with disclosed embodiments.
Figure 13:
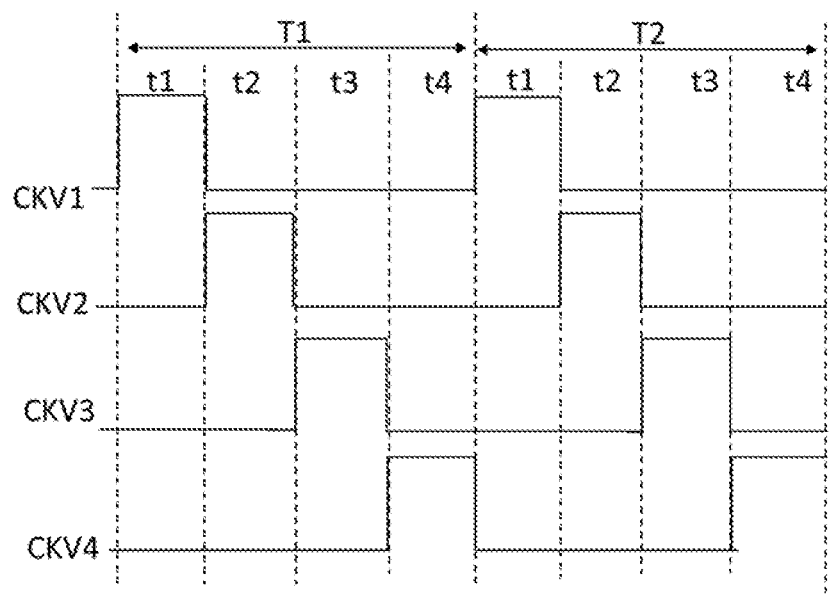
FIG. 13 illustrates a timing diagram of clock signals of a display panel consistent with disclosed embodiments.

In some embodiments, the display panel further includes a first clock signal line, a second clock signal line, a third clock signal line, and a fourth clock signal line for providing clock signals to the scan driving circuit. FIG. 10 illustrates a schematic diagram of a first scan driving sub-circuit of a display panel consistent with disclosed embodiments. FIG. 11 illustrates a schematic diagram of a second scan driving sub-circuit of a display panel consistent with disclosed embodiments. FIG. 12 illustrates a schematic diagram of a third scan driving sub-circuit of a display panel consistent with disclosed embodiments. As shown in FIG. 10 to FIG. 12, the first clock signal line L1, the second clock signal line L2, the third clock signal line L3, and the fourth clock signal line L4 provide clock signals to the start signal input terminals C1, the output signal control terminals C2, and the reset signal input terminals C3 of shift registers. FIG. 13 illustrates a timing diagram of clock signals of a display panel consistent with disclosed embodiments. Referring to FIG. 10 to FIG. 13, in a scan cycle, the first clock signal line L1 provides a first clock signal CKV1, the second clock signal line L2 provides a second clock signal CKV2, the third clock signal line L3 provides a third clock signal CKV3, and the fourth clock signal line L4 provides a fourth clock signal CKV4. Each clock cycle of a clock signal includes four moments. During a clock cycle, the first clock signal CKV1 is an active-level signal only at the first moment, the second clock signal CKV2 is an active-level signal only at the second moment, the third clock signal CKV3 is an active-level signal only at the third moment, and the fourth clock signal CKV4 is an active-level signal only at the fourth moment.

As shown in FIG. 10, in the first scan driving sub-circuit, starting from the first stage shift register, every four stages of shift registers form a first cycle group. In each first cycle group, the start signal input terminal C1 of the 4X+1-th stage shift register SR4X+1 is connected to the first clock signal line L1, the output signal control terminal C2 of the 4X+1-th stage shift register SR4X+1 is connected to the second clock signal line L2, the reset signal input terminal C3 of the 4X+1-th stage shift register SR4X+1 is connected to the third clock signal line L3.

The start signal input terminal C1 of the 4X+2-th stage shift register SR4X+2 is connected to the second clock signal line L2, the output signal control terminal C2 of the 4X+2-th stage shift register SR4X+2 is connected to the third clock signal line L3, and the reset signal input terminal C3 of the 4X+2-th stage shift register SR4X+2 is connected to the fourth clock signal line L4.

The start signal input terminal C1 of the 4X+3-th stage shift register SR4X+3 is connected to the third clock signal line L3, the output signal control terminal C2 of the 4X+3-th stage shift register SR4X+3 is connected to the fourth clock signal line L4, and the reset signal input terminal C3 of the 4X+3-th stage shift register SR4X+3 is connected to the first clock signal line L1.

The start signal input terminal C1 of the 4X+4-th stage shift register SR4X+4 is connected to the fourth clock signal line L4, the output signal control terminal C2 of the 4X+4-th stage shift register SR4X+4 is connected to the first clock signal line L1, and the reset signal input terminal C3 of the 4X+4-th stage shift register SR4X+4 is connected to the second clock signal line L2. Here, X is greater than or equal to zero.

Figure 14:
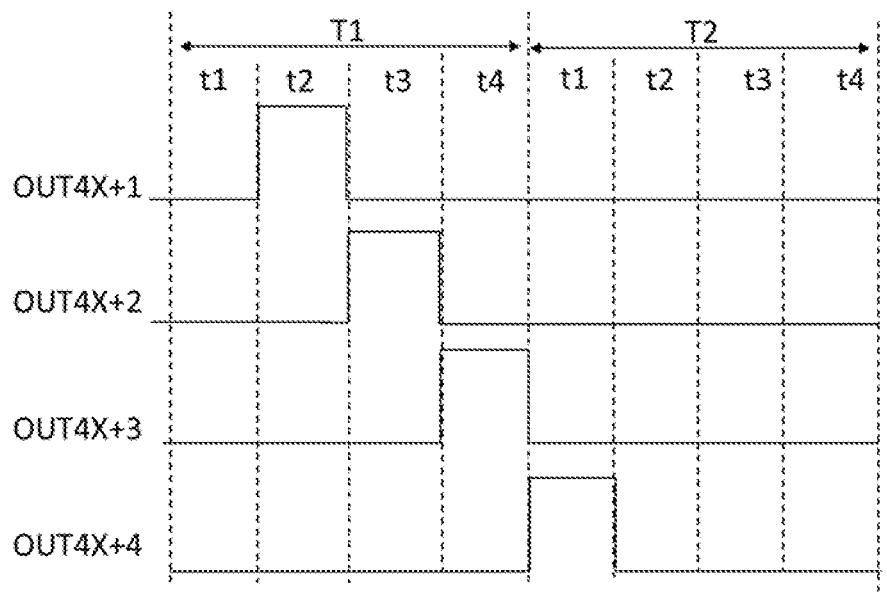
FIG. 14 illustrates a timing diagram of a first scan driving sub-circuit of a display panel consistent with disclosed embodiments.

FIG. 14 illustrates a timing diagram of a first scan driving sub-circuit of a display panel consistent with disclosed embodiments. Referring to FIG. 13 and FIG. 14, the operation timing of a first cycle group of the first scan driving sub-circuit shown in FIG. 10 is described as follows.

At the first moment t1 of the first clock cycle T1, the start signal input terminal C1 of the 4X+1-th stage shift register SR4X+1 receives a first clock signal CKV1 as an active-level signal, and the 4X+1-th stage shift register SR4X+1 is in a state in which its output terminal OUT4X+1 can outputs an active-level signal. At the second moment t2 of the first clock cycle T1, the output signal control terminal C2 of the 4X+1-th stage shift register SR4X+1 receives a second clock signal CKV2 as an active-level signal. If the input terminal IN4X+1 of the 4X+1-th stage shift register SR4X+1 receives an active-level signal at the first moment t1, the output terminal OUT4X+1 of the 4X+1-th stage shift register SR4X+1 outputs an active-level signal at the second moment t2. At the third moment t3 of the first clock cycle T1, the reset signal input terminal C3 of the 4X+1-th stage shift register SR4X+1 receives a third clock signal CKV3 as an active-level signal, and the state in which its output terminal OUT4X+1 of the 4X+1-th shift register SR4X+1 can outputs an active-level signal is reset. In the next clock cycle T2, the 4X+1-th shift register SR4X+1 can also be in a state in which its output terminal OUT4X+1 can output an active-level signal. However, since the input terminal IN4X+1 of the 4X+1-th stage shift register SR4X+1 can only receive one active-level signal in a scan cycle, the output terminal OUT4X+1 of the 4X+1-th stage shift register SR4X+1 only outputs an active-level signal at the second moment t2 of the first clock cycle T1 in a scan cycle.

Similarly, at the second moment t2 of the first clock cycle T1, the input terminal IN4X+2 receives an active-level signal, and the 4X+2-th stage shift register SR4X+2 is in a state in which its output terminal OUT4X+2 can output an active-level signal state. At the third moment t3 of the first clock cycle T1, the output signal control terminal C2 receives an active-level signal, and the output terminal OUT4X+2 outputs an active-level signal.

Similarly, at the third moment t3 of the first clock cycle T1, the input terminal IN4X+3 receives an active-level signal, and the 4X+3-th stage shift register SR4X+3 is in a state in which its output terminal OUT4X+3 can output an active-level signal state. At the fourth moment t4 of the first clock cycle T1, the output signal control terminal C2 receives an active-level signal, and the output terminal OUT4X+3 outputs an active-level signal.

Similarly, at the fourth moment t4 of the first clock cycle T1, the input terminal IN4X+4 receives an active-level signal, and the 4X+4-th stage shift register SR4X+4 is in a state in which its output terminal OUT4X+4 can output an active-level signal. At the first moment t1 of the second clock cycle T2, the output signal control terminal C2 receives an active-level signal, and the output terminal OUT4X+4 outputs an active-level signal.

Accordingly, at the second moment t2, the third moment t3, and the fourth moment t4 of the first clock cycle T1, and the first moment t1 of the second clock cycle T2, the four shift registers in a first cycle group of the first scan driving sub-circuit successively output an active-level signal, thereby achieving a progressive scanning.

As shown in FIG. 11, in the second scan driving sub-circuit, the start signal input terminal C1 of the 2X+1-th stage shift register SR2X+1 is connected to the first clock signal line L1, the output signal control terminal C2 of the 2X+1-th stage shift register SR2X+1 is connected to the third clock signal line L3, and the reset signal input terminal C3 of the 2X+1-th stage shift register SR2X+1 is connected to the fourth clock signal line L4.

The start signal input terminal C1 of the 2X+2-th stage shift register SR2X+2 is connected to the third clock signal line L3, the output signal control terminal C2 of the 2X+2-th stage shift register SR2X+2 is connected to the first clock signal line L1, and the reset signal input terminal C3 of the 2X+2-th stage shift register SR2X+2 is connected to the second clock signal line L2.

Figure 15:
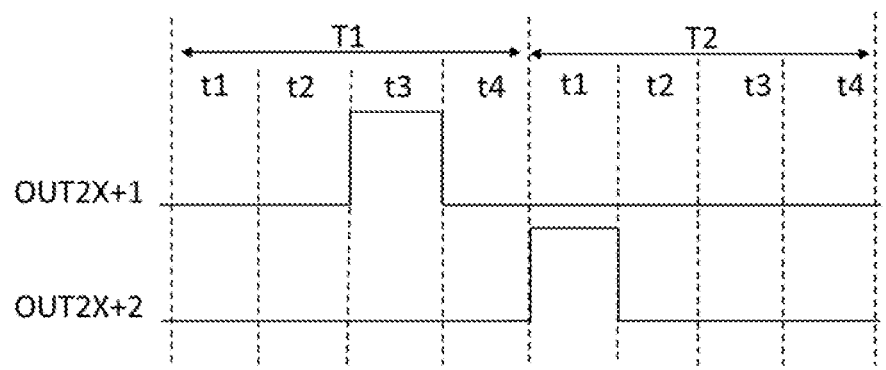
FIG. 15 illustrates a timing diagram of a second scan driving sub-circuit of a display panel consistent with disclosed embodiments.

FIG. 15 illustrates a timing diagram of a second scan driving sub-circuit of a display panel consistent with disclosed embodiments. Referring to FIG. 13 and FIG. 15, the operation timing of a second cycle group of the second scan driving sub-circuit shown in FIG. 11 is described as follows.

At the first moment t1 of the first clock cycle T1, the start signal input terminal C1 of the 2X+1-th stage shift register SR2X+1 receives a first clock signal CKV1 as an active-level signal, and the 2X+1-th stage shift register SR2X+1 is in a state in which its output terminal OUT2X+1 can output an active-level signal. At the third moment t3 of the first clock cycle T1, the output signal control terminal C2 of the 2X+1-th stage shift register SR4X+1 receives a third clock signal CKV3 as an active-level signal. If the input terminal IN2X+1 of the 2X+1-th stage shift register SR2X+1 receives an active-level signal at the first moment t1, the output terminal OUT2X+1 of the 2X+1-th stage shift register SR2X+1 outputs an active-level signal at the third moment t3. At the fourth moment t4 of the first clock cycle T1, the reset signal input terminal C3 of the 2X+1-th stage shift register SR2X+1 receives a fourth clock signal CKV4 as an active-level signal, and the state in which its output terminal OUT2X+1 of the 2X+1-th stage shift register SR2X+1 can outputs an active-level signal is reset. In the next clock cycle T2, the 2X+1-th stage shift register SR2X+1 can also be in a state in which its output terminal OUT2X+1 can output an active-level signal. However, since the input terminal IN2X+1 of the 2X+1-th stage shift register SR2X+1 can only receive one active-level signal in a scan cycle, the output terminal OUT2X+1 of the 2X+1-th stage shift register SR2X+1 only outputs an active-level signal at the third moment t3 of the first clock cycle of T1 in a scan cycle.

Similarly, at the third moment t3 of the first clock cycle T1, the input terminal IN2X+2 receives an active-level signal, and the 2X+2-th stage shift register SR2X+2 is in a state in which its output terminal OUT2X+2 can output an active-level signal. At the first moment t1 of the second clock cycle T2, the output signal control terminal C2 receives an active-level signal, and the output terminal OUT2X+2 outputs an active-level signal.

Accordingly, at the third moment t3 of the first clock cycle T1 and the first moment t1 of the second clock cycle T2, the two shift registers in a second cycle group of the second scan driving sub-circuit successively output an active-level signal.

As shown in FIG. 12, in the third scan driving sub-circuit, starting from the first stage shift register, every two stages of shift registers form a third cycle group. In each third cycle group, the start signal input terminal C1 of the 2X+1-th stage shift register SR2X+1 is connected to the second clock signal line L2, the output signal control terminal C2 of the 2X+1-th stage shift register SR2X+1 is connected to the fourth clock signal line L4, and the reset signal input terminal C3 of the 2X+1-th stage shift register SR2X+1 is connected to the first clock signal line L1.

The start signal input terminal C1 of the 2X+2-th stage shift register SR2X+2 is connected to the fourth clock signal line L4, the output signal control terminal C2 of the 2X+2-th stage shift register SR2X+2 is connected to the second clock signal line L2, and the reset signal input terminal C3 of the 2X+2-th stage shift register SR2X+2 is connected to the third clock signal line L3.

Figure 16:
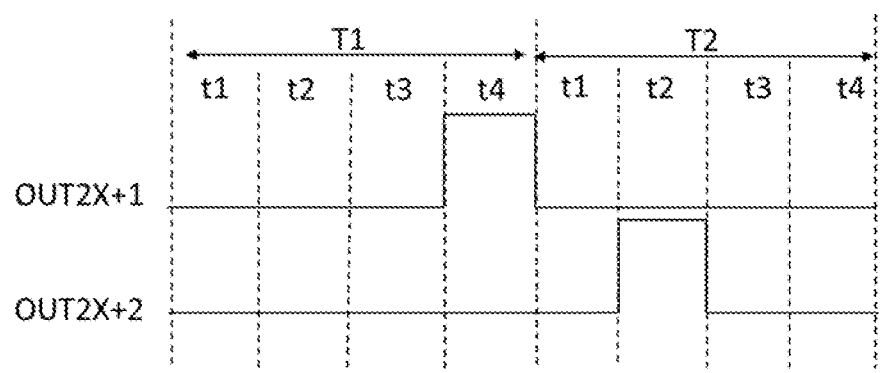
FIG. 16 illustrates a timing diagram of a third scan driving sub-circuit of a display panel consistent with disclosed embodiments.

FIG. 16 illustrates a timing diagram of a third scan driving sub-circuit of a display panel consistent with disclosed embodiments. Referring to FIG. 13 and FIG. 16, the operation timing of a third cycle group of the third scan driving sub-circuit shown in FIG. 12 is described as follows.

At the second moment t2 of the first clock cycle T1, the start signal input terminal C1 of the 2X+1-th stage shift register SR2X+1 receives a second clock signal CKV2 as an active-level signal, and the 2X+1-th stage shift register SR2X+1 is in a state in which its output terminal OUT2X+1 can output an active-level signal. At the fourth moment t4 of the first clock cycle T1, the output signal control terminal C2 of the 2X+1-th stage shift register SR2X+1 receives a fourth clock signal CKV4 as an active-level signal. If the input terminal IN2X+1 of the 2X+1-th stage shift register SR2X+1 receives an active-level signal at the second moment t2, the output terminal OUT2X+1 of the 2X+1-th stage shift register SR2X+1 outputs an active-level signal at the fourth moment t4. At the first moment t1 of the second clock cycle T2, the reset signal input terminal C3 of the 2X+1-th stage shift register SR2X+1 receives a first clock signal CKV1 as an active-level signal, and the state in which its output terminal OUT2X+1 of the 2X+1-th shift register SR2X+1 can outputs an active-level signal is reset. In a next clock cycle following the second clock cycle T2, the 2X+1-th stage shift register SR2X+1 can also be in a state in which its output terminal OUT2X+1 can output an active-level signal. However, since the input terminal IN2X+1 of the 2X+1-th stage shift register SR2X+1 can only receive one active-level signal in a scan cycle, the output terminal OUT2X+1 of the 2X+1-th stage shift register SR2X+1 only outputs an active-level signal at the fourth timing t4 of the first clock cycle T1 in a scan cycle.

Similarly, at the fourth moment t4 of the first clock cycle T1, the input terminal IN2X+2 receives an active-level signal, and the 2X+2-th stage shift register SR2X+2 is in a state in which its output terminal OUT2X+2 can output an active-level signal. At the second moment t2 of the second clock cycle T2, the output signal control terminal C2 receives an active-level signal, and the output terminal OUT2X+2 outputs an active-level signal.

Accordingly, at the fourth moment t4 of the first clock cycle T1 and the second moment t2 of the second clock cycle T2, the two shift registers in a third cycle group of the third scan driving sub-circuit successively output an active-level signal.

Putting the second scan driving sub-circuit and the third scan driving sub-circuit together, at the third moment t3 of the first clock cycle T1, the second scan driving sub-circuit outputs an active-level signal, at the fourth moment t4 of the first clock cycle T1, the third scan driving sub-circuit outputs an active-level signal, at the first moment t1 of the second clock cycle T2, the second scan driving sub-circuit outputs an active-level signal, and at the second moment t2 of the second clock cycle T2, the third scan driving sub-circuit outputs an active-level signal. That is, the second scan driving sub-circuit and the third scan driving sub-circuit cooperate to achieve an interlaced scanning.

Figure 17:
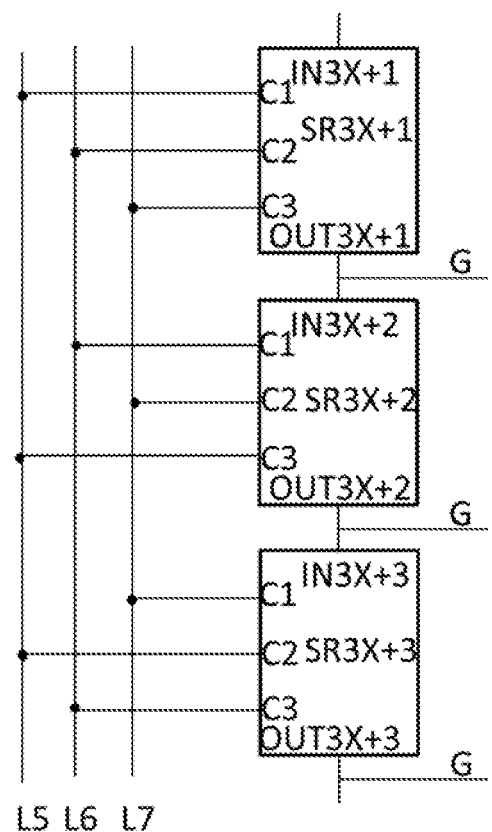
FIG. 17 illustrates a schematic diagram of a first scan driving sub-circuit of another display panel consistent with disclosed embodiments.
Figure 18:
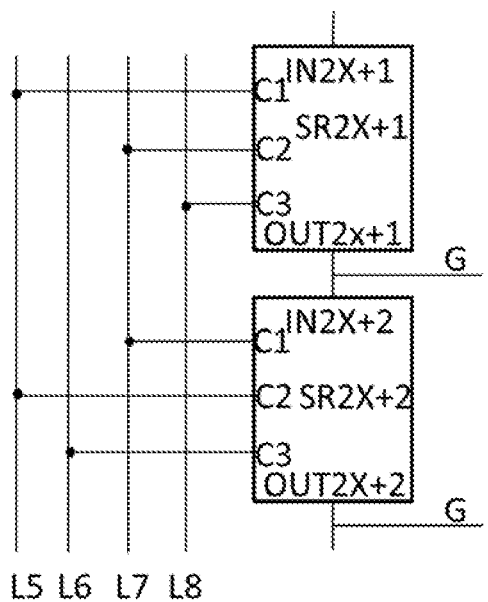
FIG. 18 illustrates a schematic diagram of a second scan driving sub-circuit of another display panel consistent with disclosed embodiments.
Figure 19:
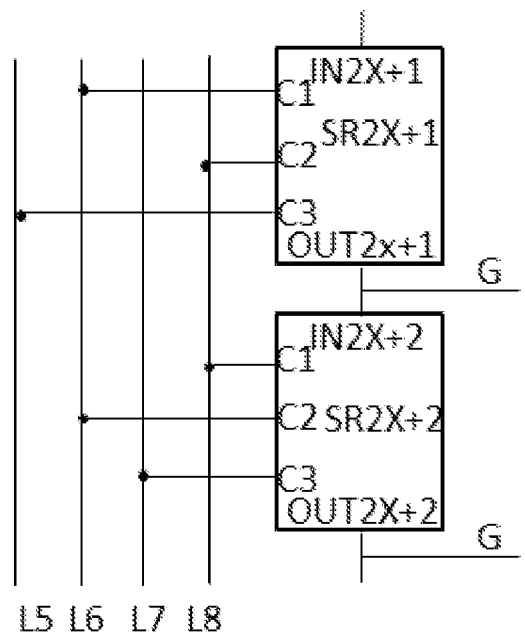
FIG. 19 illustrates a schematic diagram of a third scan driving sub-circuit of another display panel consistent with disclosed embodiments.

Further, in some embodiments, the display panel further includes a fifth clock signal line, a sixth clock signal line, a seventh clock signal line, and an eighth clock signal line. FIG. 17 illustrates a schematic diagram of a first scan driving sub-circuit of another display panel consistent with disclosed embodiments. FIG. 18 illustrates a schematic diagram of a second scan driving sub-circuit of another display panel consistent with disclosed embodiments. FIG. 19 illustrates a schematic diagram of a third scan driving sub-circuit of another display panel consistent with disclosed embodiments.

As shown in FIG. 17 to FIG. 19, the fifth clock signal line L5, the sixth clock signal line L6, the seventh clock signal line L7, and the eighth clock signal line L8 provide clock signals to the start signal input terminals C1, the output signal control terminals C2, and the reset signal input terminals C3 of the shift registers.

Figure 20:
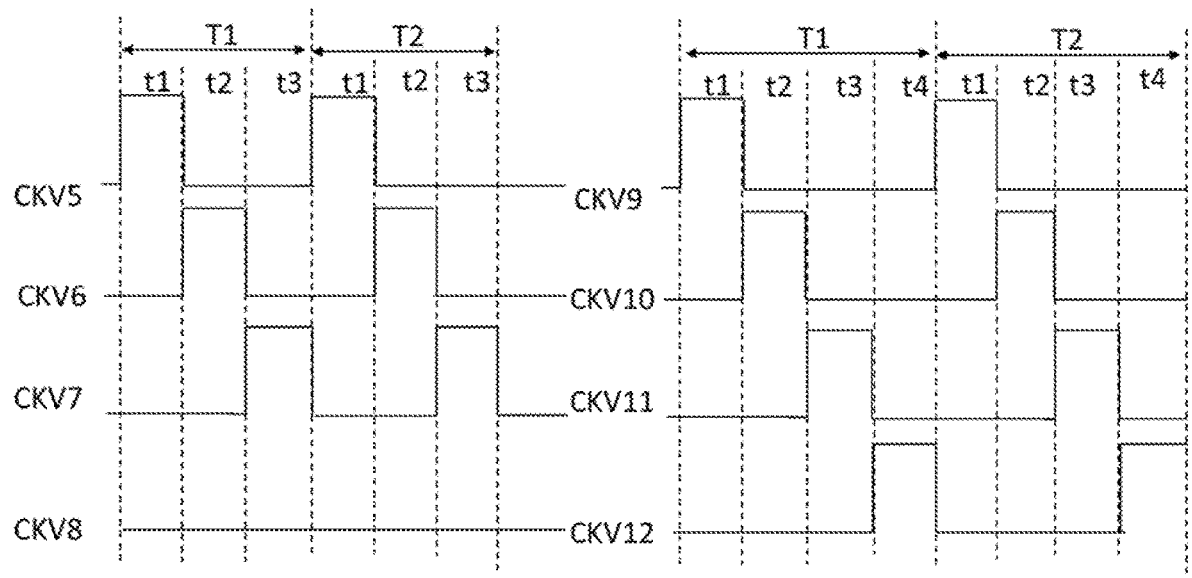
FIG. 20 illustrates a timing diagram of clock signals of another display panel consistent with disclosed embodiments.

FIG. 20 illustrates a timing diagram of a clock signal of another display panel consistent with disclosed embodiments. Referring to FIG. 17 to FIG. 20, a scan cycle includes a first time period and a second time period. The first time period is a period to drive the scan lines in the first area, and the second time period is a period to drive the scan lines in the second area.

During the first time period, that is, when driving the scan lines in the first area, the fifth clock signal line L5 provides a fifth clock signal CKV5, the sixth clock signal line L6 provides a sixth clock signal CKV6, the seventh clock signal line L7 provides a seventh clock signal CKV7, and the eighth clock signal line L8 provides an eighth clock signal CKV8. Each clock cycle of a clock signal includes three moments. In a clock cycle, the fifth clock signal CKV5 is an active-level signal only at the first moment, the sixth clock signal CKV6 is an active-level signal only at the second moment, the seventh clock signal CKV7 is an active-level signal only at the third moment, and the eighth clock signal CKV8 continues to be at an inactive-level signal.

During the second time period, that is, when driving the scan lines in the second area, the fifth clock signal line L5 provides a ninth clock signal CKV9, the sixth clock signal line L6 provides a tenth clock signal CKV10, the seventh clock signal line L7 provides an eleventh clock signal CKV11, and the eighth clock signal line L8 provides a twelfth clock signal CKV12. Each clock cycle of a clock signal includes four moments. In a clock cycle, the ninth clock signal CKV9 is an active-level signal only at the first moment, the tenth clock signal CKV10 is an active-level signal only at the second moment, the eleventh clock signal CKV11 is an active-level signal only at the third moment, and the twelfth clock signal CKV12 is an active-level signal only at the fourth moment.

As shown in FIG. 17, in the first scan driving sub-circuit, starting from the first stage shift register, every three stages of shift registers form a fourth cycle group. In each fourth cycle group, the start signal input terminal C1 of the 3X+1-th stage shift register SR3X+1 is connected to the fifth clock signal line L5, the output signal control terminal C2 of the 3X+1-th stage shift register SR3X+1 is connected to the sixth clock signal line L6, and the reset signal input terminal C3 of the 3X+1-th stage shift register SR3X+1 is connected to the seventh clock signal line L7.

The start signal input terminal C1 of the 3X+2-th stage shift register SR3X+1 is connected to the sixth clock signal line L6, the output signal control terminal C2 of the 3X+2-th stage shift register SR3X+2 is connected to the seventh clock signal line L7, and the reset signal input terminal C3 of the 3X+2-th stage shift register SR3X+2 is connected to the fifth clock signal line L5.

The start signal input terminal C1 of the 3X+3-th stage shift register SR3X+3 is connected to the seventh clock signal line L7, the output signal control terminal C2 of the 3X+3-th stage shift register SR3X+3 is connected to the fifth clock signal line L5, and the reset signal input terminal C3 of the 3X+3-th stage shift register SR3X+3 is connected to the sixth clock signal line L6. The first scan driving sub-circuit is not connected to the eighth clock signal line L8. Here, X is greater than or equal to 0.

Figure 21:
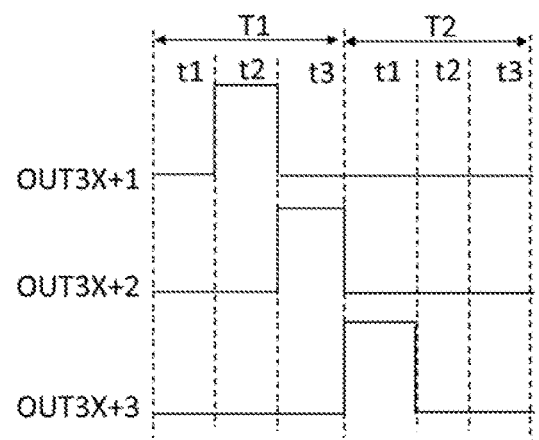
FIG. 21 illustrates a timing diagram of a first scan driving sub-circuit of another display panel consistent with disclosed embodiments.

FIG. 21 illustrates a timing diagram of a first scan driving sub-circuit of another display panel consistent with disclosed embodiments. Referring to FIG. 20 and FIG. 21, the operation timing of a fourth cycle group of the first scan driving sub-circuit shown in FIG. 17 is described as follows.

During the first time period, the first scan driving sub-circuit scans the first area, and during the second time period, the first scan driving sub-circuit does not output an active-level signal. Here, only the operation timing of the first scan driving sub-circuit in the first time period is described.

At the first moment t1 of the first clock cycle T1, the start signal input terminal C1 of the 3X+1-th stage shift register SR3X+1 receives a fifth clock signal CKV5 as an active-level signal, and the 3X+1-th stage shift register SR3X+1 is in a state in which its output terminal OUT3X+1 can output an active-level signal. At the second moment t2 of the first clock cycle T1, the output signal control terminal C2 of the 3X+1-th stage shift register SR3X+1 receives a sixth clock signal CKV6 as an active-level signal. If the input terminal IN3X+1 of the 3X+1-th stage shift register SR3X+1 receives an active-level signal at the first moment t1, the output terminal OUT3X+1 of the 3X+1-th stage shift register SR3X+1 outputs an active-level signal at the second moment t2. At the third moment t3 of the first clock cycle T1, the reset signal input terminal C3 of the 3X+1-th stage shift register SR3X+1 receives a seventh clock signal CKV7 as an active-level signal, the state at which the output terminal OUT3X+1 of the 3X+1-th shift register SR3X+1 can outputs an active-level signal is reset. In the next clock cycle T2, the 3X+1-th stage shift register SR3X+1 can also be in a state in which its output terminal OUT3X+1 can output an active-level signal. However, since the input terminal IN3X+1 of the 3X+1-th stage shift register SR3X+1 can receive an active-level signal only once in a scan cycle, the output terminal OUT3X+1 of the 3X+1-th stage shift register SR3X+1 only outputs an active-level signal at the second moment t2 of the first clock cycle T1 in a scan cycle.

Similarly, at the second moment t2 of the first clock cycle T1, the input terminal IN3X+2 receives an active-level signal, and the 3X+2-th stage shift register SR3X+2 is in a state in which its output terminal OUT3X+2 can output an active-level signal. At the third moment t3 of the first clock cycle T1, the output signal control terminal C2 receives an active-level signal, and the output terminal OUT3X+2 outputs an active-level signal.

Similarly, at the third moment t3 of the first clock cycle T1, the input terminal IN3X+3 receives an active-level signal, and the 3X+3-th stage shift register SR3X+3 is in a state in which its output terminal OUT3X+3 can output an active-level signal. At the first moment t1 of the second clock cycle T2, the output signal control terminal C2 receives an active-level signal, and the output terminal OUT3X+3 outputs an active-level signal.

Accordingly, at the second moment t2 and the third moment t3 of the first clock cycle T1, and the first moment t1 of the second clock cycle T2, the three shift registers of a fourth cycle group of the first scan driving sub-circuit successively output an active-level signal, to achieve a progressive scanning.

As shown in FIG. 18, in a second scan driving sub-circuit, starting from the first stage shift register, every two stages of shift registers form a fifth cycle group. In each fifth cycle group, the start signal input terminal C1 of the 2X+1-th stage shift register SR2X+1 is connected to the fifth clock signal line L5, the output signal control terminal C2 of the 2X+1-th stage shift register SR2X+1 is connected to the seventh clock signal line L7, and the reset signal input terminal C3 of the 2X+1-th stage shift register SR2X+1 is connected to the eighth clock signal line L8.

The start signal input terminal C1 of the 2X+2-th stage shift register SR2X+2 is connected to the seventh clock signal line L7, the output signal control terminal C2 of the 2X+2-th stage shift register SR2X+2 is connected to the fifth clock signal line L5, and the reset signal input terminal C3 of the 2X+2-th stage shift register SR2X+2 is connected to the sixth clock signal line L6.

Figure 22:
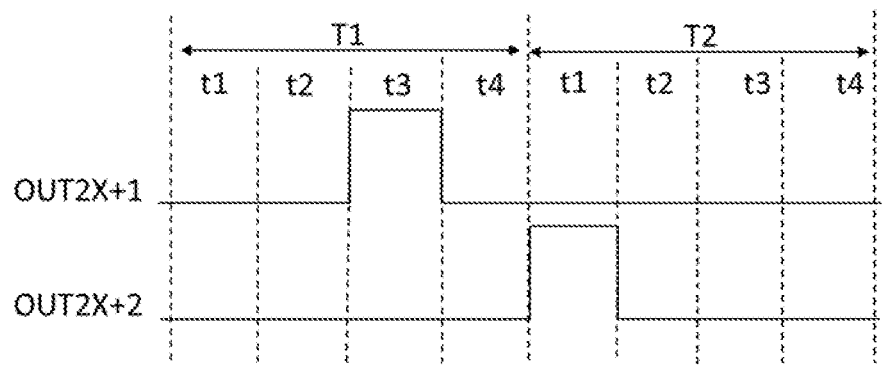
FIG. 22 illustrates a timing diagram of a second scan driving sub-circuit of another display panel consistent with disclosed embodiments.

FIG. 22 illustrates a timing diagram of a second scan driving sub-circuit of another display panel consistent with disclosed embodiments. Referring to FIG. 20 and FIG. 22, the operation timing of a fifth cycle group of the second scan driving sub-circuit shown in FIG. 18 is described as follows.

During the second time period, the second scan driving sub-circuit scans the second area. During the first time period, the second scan driving sub-circuit does not output an active-level signal. Here, only the operation timing of the second scan driving sub-circuit in the second time period is described.

At the first moment t1 of the first clock cycle T1, the start signal input terminal C1 of the 2X+1-th stage shift register SR2X+1 receives a ninth clock signal CKV9 as an active-level signal, and the 2X+1-th stage shift register SR2X+1 is in a state in which its output terminal OUT2X+1 can output an active-level signal. At the third moment t3 of the first clock cycle T1, the output signal control terminal C2 of the 2X+1-th stage shift register SR2X+1 receives an eleventh clock signal CKV11 as an active-level signal. If the input terminal IN2X+1 of the 2X+1-th stage shift register SR2X+1 receives an active-level signal at the first moment t1, the output terminal OUT2X+1 of the 2X+1-th stage shift register SR2X+1 outputs an active-level signal at the third moment t3. At the fourth moment t4 of the first clock cycle T1, the reset signal input terminal C3 of the 2X+1-th stage shift register 2X+1 receives a twelfth clock signal CKV12 as an active-level signal, and the state in which its output terminal OUT2X+1 of the 2X+1-th stage shift register SR2X+1 can outputs an active-level signal is reset. In the next clock cycle T2, the 2X+1-th stage shift register SR2X+1 can also be in a state in which its output terminal OUT2X+1 can output an active-level signal. However, since the input terminal IN2X+1 of the 2X+1-level shift register SR2X+1 can receive an active-level signal only once in a scan cycle, the output terminal OUT2X+1 of the 2X+1-th stage shift register SR2X+1 only outputs an active-level signal at the third moment t3 of the first clock cycle T1 in a scan cycle.

Similarly, at the third moment t3 of the first clock cycle T1, the input terminal IN2X+2 receives an active-level signal, and the 2X+2-th stage shift register 2X+2 is in a state in which its output terminal OUT2X+2 can output an active-level signal. At the first moment t1 of the second clock cycle T2, the output signal control terminal C2 receives an active-level signal, and the output terminal OUT2X+2 outputs an active-level signal.

Accordingly, at the third moment t3 of the first clock cycle T1 and the first moment t1 of the second clock cycle T2, the two shift registers in a fifth cycle group of the second scan driving sub-circuit successively output an active-level signal.

As shown in FIG. 19, in the third scan driving sub-circuit, starting from the first stage shift register, every two stages of shift registers form a sixth cycle group. In each sixth cycle group, the start signal input terminal C1 of the 2X+1-th stage shift register SR2X+1 is connected to the sixth clock signal line L6, the output signal control terminal C2 of the 2X+1-th stage shift register SR2X+1 is connected to the eighth clock signal line L8, and the reset signal input terminal C3 of the 2X+1-th stage shift register SR2X+1 is connected to the fifth clock signal line L5.

The start signal input terminal C1 of the 2X+2-th stage shift register SR2X+2 is connected to the eighth clock signal line L8, the output signal control terminal C2 of the 2X+2-th stage shift register SR2X+2 is connected to the sixth clock signal line L6, and the reset signal input terminal C3 of the 2X+2-th stage shift register SR2X+2 is connected to the seventh clock signal line L7.

Figure 23:
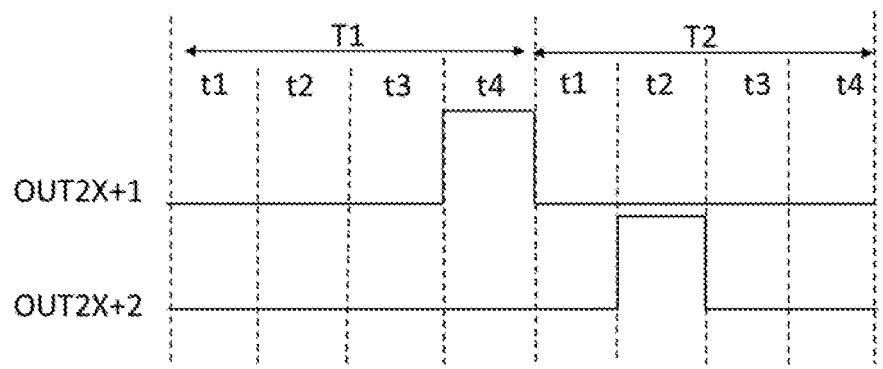
FIG. 23 illustrates a timing diagram of a third scan driving sub-circuit of another display panel consistent with disclosed embodiments.

FIG. 23 illustrates a timing diagram of a third scan driving sub-circuit of another display panel consistent with disclosed embodiments. Referring to FIG. 20 and FIG. 23, the operation timing of a sixth cycle group of the third scan driving sub-circuit shown in FIG. 18 is described as follows.

During the second time period, the third scan driving sub-circuit scans the second area. During the first time period, the third scan driving sub-circuit does not output an active-level signal. Here only operation timing of the third scan driving sub-circuit in the second time period is described.

At the second moment t2 of the first clock cycle T1, the start signal input terminal C1 of the 2X+1-th stage shift register SR2X+1 receives a tenth clock signal CKV10 as an active-level signal, and the 2X+1-th stage shift register SR2X+1 is in a state in which its output terminal OUT2X+1 can output an active-level signal. At the fourth moment t4 of the first clock cycle T1, the output signal control terminal C2 of the 2X+1-th stage shift register SR2X+1 receives a twelfth clock signal CKV12 as an active-level signal. If the input terminal IN2X+1 of the 2X+1-th stage shift register SR2X+1 receives an active-level signal at the second moment t2, the output terminal OUT2X+1 of the 2X+1-th stage shift register SR2X+1 outputs an active-level signal at the fourth moment t4. At the first moment t1 of the second clock cycle T2, the reset signal input terminal C3 of the 2X+1-th stage shift register SR2X+1 receives a ninth clock signal CKV9 as an active-level signal, and the state in which its output terminal OUT2X+1 of the 2X+1-th stage shift register SR2X+1 can outputs an active-level signal is reset. In a clock cycle following the second clock cycle T2, the 2X+1-th stage shift register SR2X+1 can also be in the state in which its output terminal OUT2X+1 can output an active-level signal. However, since the input terminal IN2X+1 of the 2X+1-th stage shift register SR2X+1 can receive an active-level signal only once in a scan cycle, the output terminal OUT2X+1 of the 2X+1-th stage shift register SR2X+1 outputs an active-level signal only at the fourth moment t4 of the first clock cycle T1 in a scan cycle.

Similarly, at the fourth moment t4 of the first clock cycle T1, the input terminal IN2X+2 receives an active-level signal, and the 2X+2-th stage shift register SR2X+2 is in a state in which its output terminal OUT2X+2 can output an active-level signal. At the second moment t2 of the second clock cycle T2, the output signal control terminal C2 receives an active-level signal, and the output terminal OUT2X+2 outputs an active-level signal.

Accordingly, at the fourth moment t4 of the first clock cycle T1 and the second moment t2 of the second clock cycle T2, the two shift registers in a sixth cycle group of the third scan driving sub-circuit successively output an active-level signal.

Putting the second scan driving sub-circuit and the third scan driving sub-circuit together, at the third moment t3 of the first clock cycle T1, the second scan driving sub-circuit outputs an active-level signal, at the fourth moment t4 of the first clock cycle T1, the third scan driving sub-circuit outputs an active-level signal, at the first moment t1 of the second clock cycle T2, the second scan driving sub-circuit outputs an active-level signal, and at the second moment t2 of the second clock cycle T2, the third scan driving sub-circuit outputs an active-level signal. That is, the second scan driving sub-circuit and the third scan driving sub-circuit cooperate to achieve an interlaced scanning.

Figure 24:
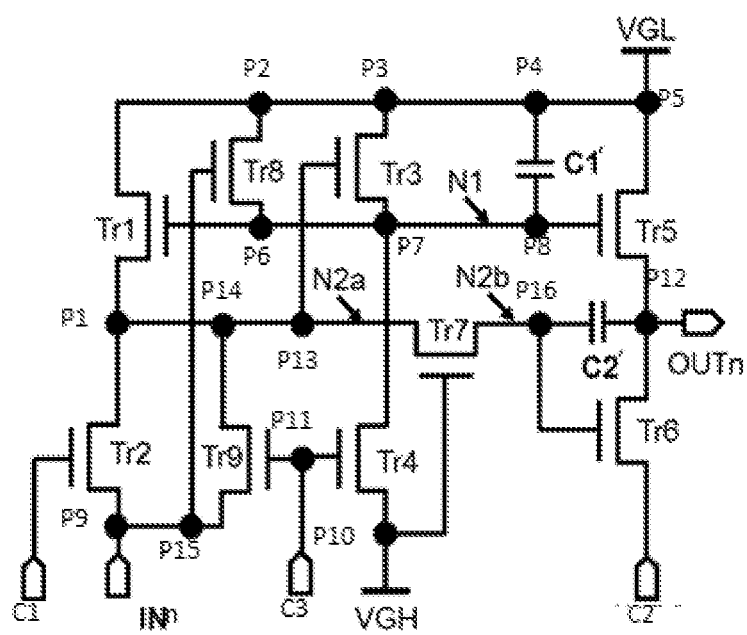
FIG. 24 illustrates an internal circuit diagram of a shift register of a display panel consistent with disclosed embodiments.

Further, FIG. 24 illustrates an internal circuit diagram of a shift register of a display panel consistent with disclosed embodiments. In some embodiments, all of the shift registers in a display panel have the same structure as the shift register shown in FIG. 24. As shown in the figure, the shift register includes an input terminal INn, an output terminal OUTn, a start signal input terminal C1, an output signal control terminal C2, a reset signal input terminal C3, a negative voltage input terminal VGL, a positive voltage input terminal VGH, nine N-type transistors, and two capacitors.

The first terminal of the first transistor Tr1 is connected to the first terminal of the second transistor Tr2, the second terminal of the first transistor Tr1 is connected to the negative voltage input terminal VGL, and the control terminal of the first transistor Tr1 is connected to the control terminal of the fifth transistor Tr5. A first node P1 is disposed between the first terminal of the first transistor Tr1 and the first terminal of the second transistor Tr2. Between the second terminal of the first transistor Tr1 and the negative voltage input terminal VGL, there are a second node P2, a third node P3, a fourth node P4, and a fifth node P5. A sixth node P6, a seventh node P7, and an eighth node P8 are sequentially disposed between the control terminal of the first transistor Tr1 and the control terminal of the fifth transistor Tr5.

The second terminal of the second transistor Tr2 is connected to the input terminal INn. The control terminal of the second transistor Tr2 is connected to the start signal input terminal C1. Between the second terminal of the second transistor Tr2 and the first terminal of the input terminal INn, there is a ninth node P9.

The first terminal of the third transistor Tr3 is connected to the third node P3, and the second terminal of the third transistor Tr3 is connected to the seventh node P7.

The first terminal of the fourth transistor Tr4 is connected to the seventh node P7, the second terminal of the fourth transistor Tr4 is connected to the positive voltage input terminal VGH, and the control terminal of the fourth transistor Tr4 is connected to the control terminal of the ninth transistor Tr9. There is a tenth node P10 between the second terminal of the fourth transistor Tr4 and the positive voltage input terminal VGH, and an eleventh node P11 between the control terminal of the fourth transistor Tr4 and the control terminal of the ninth transistor Tr9. The eleventh node P11 is connected to the reset signal input terminal C3.

The first terminal of the fifth transistor Tr5 is connected to the fifth node P5, and the second terminal of the fifth transistor Tr5 is connected to the first terminal of the sixth transistor Tr6. There is a twelfth node P12 between the second terminal of the fifth transistor Tr5 and the first terminal of the sixth transistor Tr6. The twelfth node P12 is connected to the output terminal OUTn.

The second terminal of the sixth transistor Tr6 is connected to the output signal control terminal C2.

The first terminal of the seventh transistor Tr7 is connected to the first node P1, and the control terminal of the seventh transistor Tr7 is connected to the tenth node P10. A thirteenth node P13 and a fourteenth node P14 are sequentially located between the first terminal of the seventh transistor Tr7 and the first node P1. The thirteenth node is connected to the control terminal of the third transistor Tr3.

The first terminal of the eighth transistor Tr8 is connected to the second node P2, and the second terminal of the eighth transistor Tr8 is connected to the sixth node P6.

The first terminal of the ninth transistor Tr9 is connected to the fourteenth node P14, and the second terminal of the ninth transistor Tr9 is connected to the ninth node P9. There is a fifteenth node P15 between the second terminal of the ninth transistor Tr9 and the ninth node P9. The fifteenth node P15 is connected to the control terminal of the eighth transistor Tr8.

The first terminal of the first capacitor C1' is connected to the fourth node P4, and the second terminal of the first capacitor C1' is connected to the eighth node P8.

The first terminal of the second capacitor C2' is connected to the twelfth node P12, and the second terminal of the second capacitor C2' is connected to the second terminal of the seventh transistor Tr7. There is a sixteenth node P16 between the second terminal of the second capacitor C2' and the second terminal of the seventh transistor Tr7. The sixteenth node P16 is connected to the control terminal of the sixth transistor Tr6.

Figure 25:
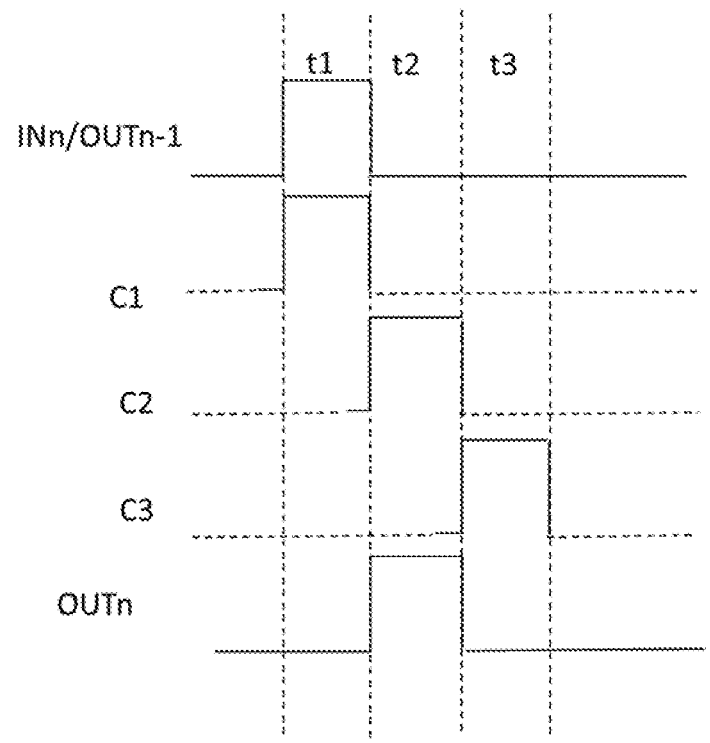
FIG. 25 illustrates a timing diagram of a shift register as shown in FIG. 24 in a first scan driving sub-circuit of a display panel consistent with disclosed embodiments.

FIG. 25 illustrates a timing diagram of a shift register as shown in FIG. 24 in a first scan driving sub-circuit of a display panel consistent with disclosed embodiments. Referring to FIG. 24 and FIG. 25, when a shift register as shown in FIG. 24 is placed in a first scan driving sub-circuit, the operation timing is as follows.

At the first moment t1, the input terminal INn of the shift register receives an active-level signal (also called "high-level signal"), and the start signal input terminal C1 receives a high-level signal. At this moment, the second transistor Tr2 is turned on, the node N2a receives a high-level signal, the seventh transistor Tr7 is turned on, the node N2b receives a high-level signal, the node N1 receives a low-level signal, the fifth transistor Tr5 is turned off, and the output terminal OUTn outputs a low-level signal.

At the second moment t2, the output signal control terminal C2 receives a high-level signal. At this moment, the second transistor Tr2 is turned off, the node N2b still has a high-level signal, the node N1 receives a low-level signal, the fifth transistor Tr5 is turned off, the sixth transistor is turned on, and the output terminal OUTn outputs a high-level signal, to complete a shifting of a high-level signal between the output terminal OUTn and the input terminal INn.

At the third moment t3, the reset signal input terminal C3 receives a high-level signal. At this moment, the fourth transistor Tr4 is turned on, the node N1 receives a high-level signal, the fifth transistor Tr5 is turned on, and the output terminal OUTn outputs a low-level signal.

Figure 26:
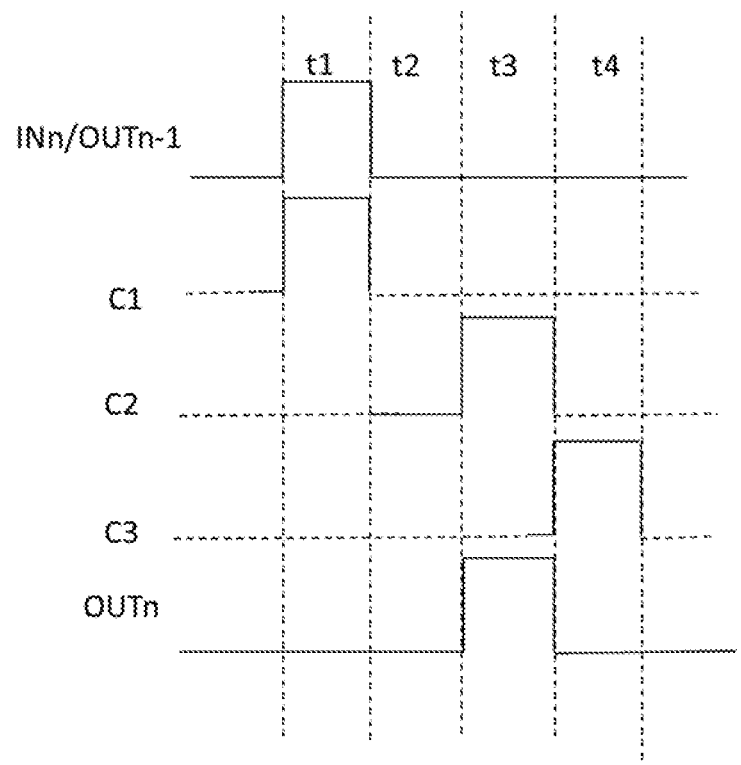
FIG. 26 illustrates a timing diagram of a shift register as shown in FIG. 24 in a second scan driving sub-circuit and a third scan driving sub-circuit of a display panel consistent with disclosed embodiments.

FIG. 26 illustrates a timing diagram of a shift register as shown in FIG. 24 in a second scan driving sub-circuit and a third scan driving sub-circuit of a display panel consistent with disclosed embodiments. Referring to FIG. 24 and FIG. 26, when a shift register as shown in FIG. 24 is placed in a second scan driving sub-circuit or a third scan driving sub-circuit, the operation timing is as follows.

At the first moment t1, the input terminal INn of the shift register receives an active-level signal (namely "high-level signal"), and the start signal input terminal C1 receives a high-level signal. At this moment, the second transistor Tr2 is turned on, the node N2a receives a high-level signal, the seventh transistor Tr7 is turned on, the node N2b receives a high-level signal, the node N1 receives a low-level signal, the fifth transistor Tr5 is turned off, and the output terminal OUTn outputs a low-level signal.

At the second moment t2, the output signal control terminal C2 receives a low-level signal. At this moment, the second transistor Tr2 is turned off, the node N2b still has a high-level signal, the node N1 receives a low-level signal, the fifth transistor Tr5 is turned off, the sixth transistor is turned on, and the output terminal OUTn outputs a low-level signal.

At the third moment t3, the output signal control terminal C2 receives a high-level signal. At this moment, the second transistor Tr2 is turned off, the second capacitor C2' is turned on, the node N2b still has a high-level signal, the node N1 receives a low-level signal, the fifth The transistor Tr5 is turned off, the sixth transistor is turned on, and the output terminal OUTn outputs a high-level signal, to complete a shifting of a high-level signal between the output terminal OUTn and the input terminal INn.

At the fourth moment t4, the reset signal input terminal C3 receives a high-level signal. At this moment, the fourth transistor Tr4 is turned on, the node N1 receives a high-level signal, the fifth transistor Tr5 is turned on, and the output terminal OUTn outputs a low-level signal.

The above sections describe how the first scan driving sub-circuit implements a progressive scanning, how the second scan driving sub-circuit and the third scan driving sub-circuit implement an interlaced scanning, and the implementations and operation timings of the shift registers. For a display panel as a whole, how the first scan driving sub-circuit is cascaded with the second scan driving sub-circuit varies depending on whether the first area is scanned first or the second area is scanned first in a scan cycle.

Figure 27:
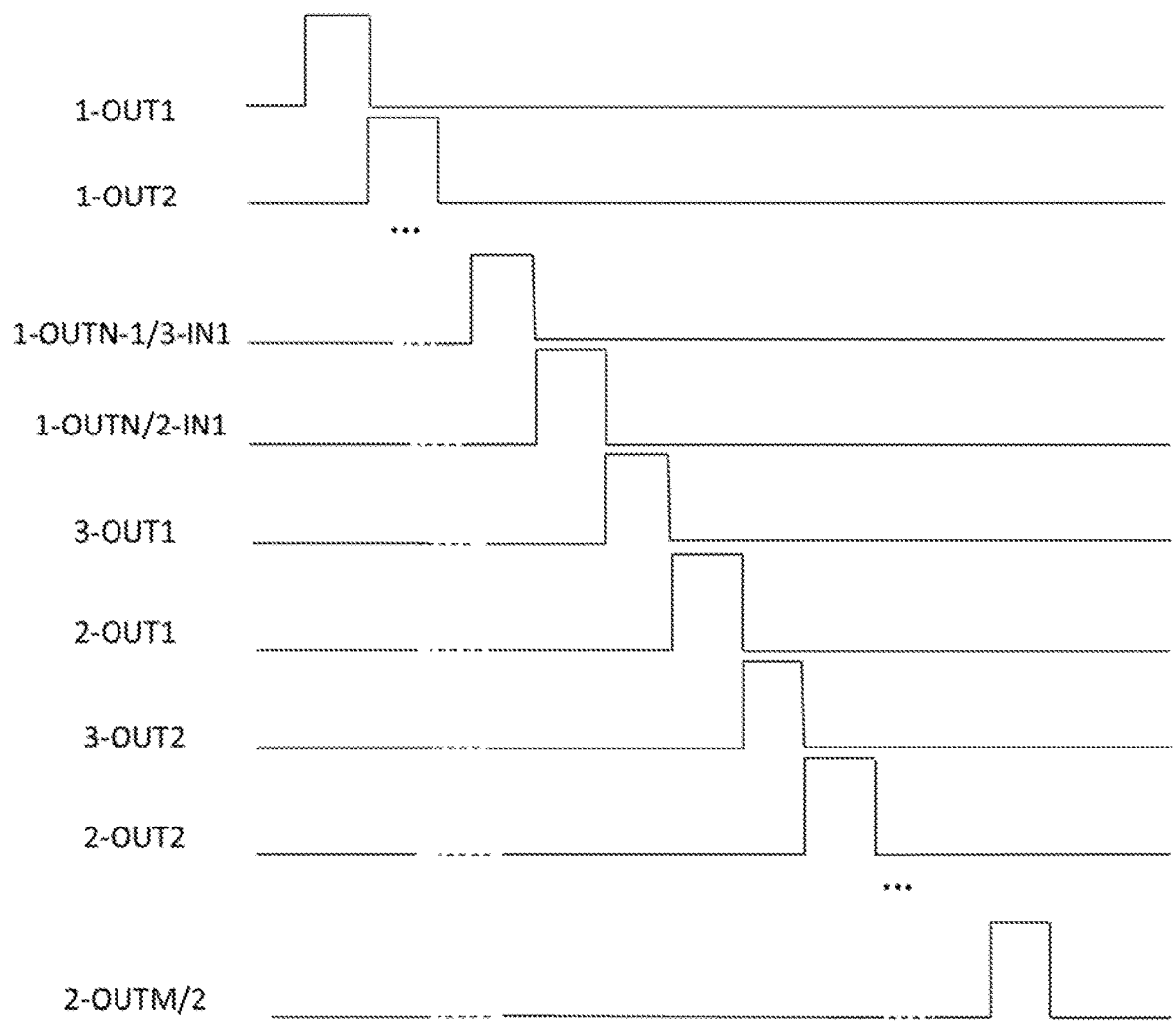
FIG. 27 illustrates a timing diagram of a display panel consistent with disclosed embodiments.

FIG. 27 illustrates a timing diagram of a display panel consistent with disclosed embodiments. In some embodiments, the first area is scanned before the second area in a scan cycle of the display panel. In the first area, the first scanned row of sub-pixels is the first row of sub-pixels, and the last scanned row of sub-pixels is the N-th row of sub-pixels. In the second area, the first scanned row of sub-pixels is the N+1-th row of sub-pixels, and the last scanned row of sub-pixels is the N+M-th row of sub-pixels. It should be noted that the first row of sub-pixels described here should not be constructed as a limitation to the first row of sub-pixels in the display panel, but rather as an expression of the scanning order of the first area and the second area.

First, the first area is scanned. A valid signal is sequentially outputted by the output terminal 1-OUT1 of the first stage shift register until the output terminal 1-OUTN of the last stage shift register of the first scan driving sub-circuit, and the thin film transistors of the first row to N-th row of sub-pixels of the display panel are sequentially turned on row by row, to accomplish the scanning of the first area.

Next, the second area is scanned. The signal received by the input terminal 3-IN1 of the first stage shift register of the third scan driving sub-circuit is the same signal outputted by the output terminal 1-OUTN−1 of the second-to-last stage shift register of the first scan driving sub-circuit. Accordingly, the signal of the output terminal 3-OUT1 of the first stage shift register of the third scan driving sub-circuit can turn on the thin film transistors of the N+1-th row of sub-pixels of the display panel. The input terminal 2-IN1 of the first stage shift register of the second scan driving sub-circuit is connected to the output terminal 1-OUTN of the last stage shift register of the first scan driving sub-circuit. That is, the input terminal 2-IN1 of the first stage shift register of the second scan driving sub-circuit receives the signal outputted by the output terminal 1-OUTN of the last stage shift register of the first scan driving sub-circuit. Accordingly, the signal of the output terminal 2-OUT1 of the first stage shift register of the second scan driving sub-circuit can turn on the thin film transistors of the N+2-th row of sub-pixels of the display panel. Then the signal of the output terminal 3-OUT2 of the second stage shift register of the third scan driving sub-circuit can turn on the thin film transistors of the N+3 -th row of sub-pixels of the display panel, the signal of the output terminal 2-OUT2 of the second stage shift register of the second scan driving sub-circuit can turn on the thin film transistors of the N+4-th row of sub-pixels of the display panel, and so on, until the last stage shift register 2-OUTM/2 of the second scan driving sub-circuit turns on the thin film transistors of the N+M-th row of sub-pixels of the display panel, to accomplish the scanning of the second area, and finish a scan cycle.

Figure 28:
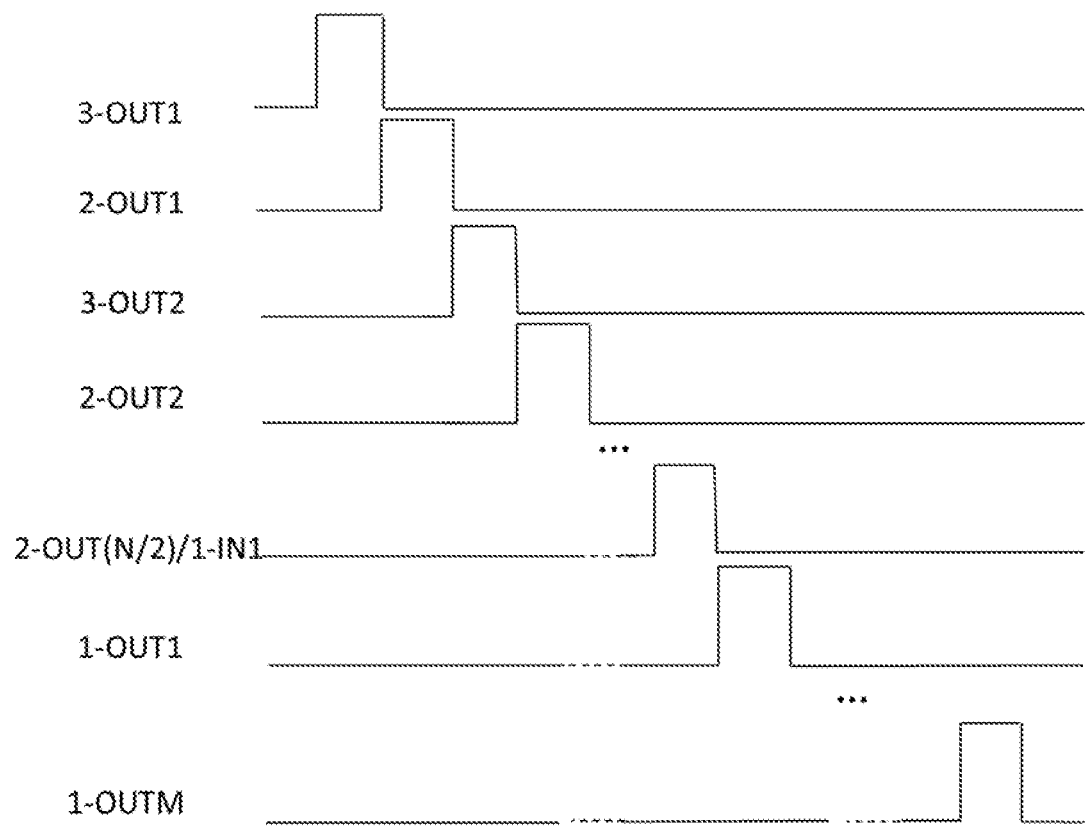
FIG. 28 illustrates a timing diagram of another display panel consistent with disclosed embodiments.

Further, FIG. 28 illustrates a timing diagram of another display panel consistent with disclosed embodiments. In some embodiments, the first area is scanned after the second area in a scan cycle of the display panel. The first scanned row of sub-pixels in the second area is the first row of sub-pixels, and the last scanned row of sub-pixels in the second area is the N-th row of sub-pixels. The first scanned row of sub-pixels in the first area is the N+1-th row of sub-pixels, the last scanned row of sub-pixels in the first area is the N+M-th row of sub-pixels. It should be noted that the first row of sub-pixels described here should not be constructed as a limitation to the first row of sub-pixels in the display panel, but rather as an expression of the scanning order of the first area and the second area.

First, the second area is scanned. The input terminal of the first stage shift register of the third scan driving sub-circuit receives an active-level signal one moment earlier than the input terminal of the first stage shift register of the second scan driving sub-circuit to receive an active-level signal. Then the signal of the output terminal 3-OUT1 of the first stage shift register of the third scan driving sub-circuit can turn on the thin film transistors of the first row of sub-pixels of the display panel, the signal of the output terminal 2-OUT1 of the first stage shift register of the second scan driving sub-circuit can turn on the thin film transistors of the second row of sub-pixels of the display panel, the signal of the output terminal 3-OUT2 of the second stage shift register of the third scan driving sub-circuit can turn on the thin film transistors of the third row of the sub-pixels of the display panel, the signal of the output terminal 2-OUT2 of the second stage shift register of the second scan driving sub-circuit can turn on the thin film transistors of the fourth row of sub-pixels of the display panel, and so on, until the output terminal 2-OUTN/2 of the last stage shift register of the second scan driving sub-circuit turns on the thin film transistors of the N-th row of sub-pixels of the display panel, to accomplish the scanning of the second area.

Then, the first area is scanned. The input terminal 1-IN1 of the first stage shift register of the first scan driving sub-circuit is connected to the output terminal of the last stage shift register of the second scan driving sub-circuit. Accordingly, the signal of the output terminal 1-OUT1 of the first stage shift register of the first scan driving sub-circuit can turn on the thin film transistors of the N+1-th row of sub-pixels of the display panel. A valid signal is then sequentially outputted from the output terminal 1-OUT1 of the first stage shift register until the output terminal 1-OUTM of the last stage shift register of the first scan driving sub-circuit. The thin film transistors of the N+1-th to N+M-th row of sub-pixels of the display panel are sequentially turned on row by row, to accomplish the scanning of the first area, and finish a scan cycle.

Specifically, based on the specific shape of a special-shaped display panel, the scan driving circuits of the display panel can be correspondingly arranged.

Figure 29:
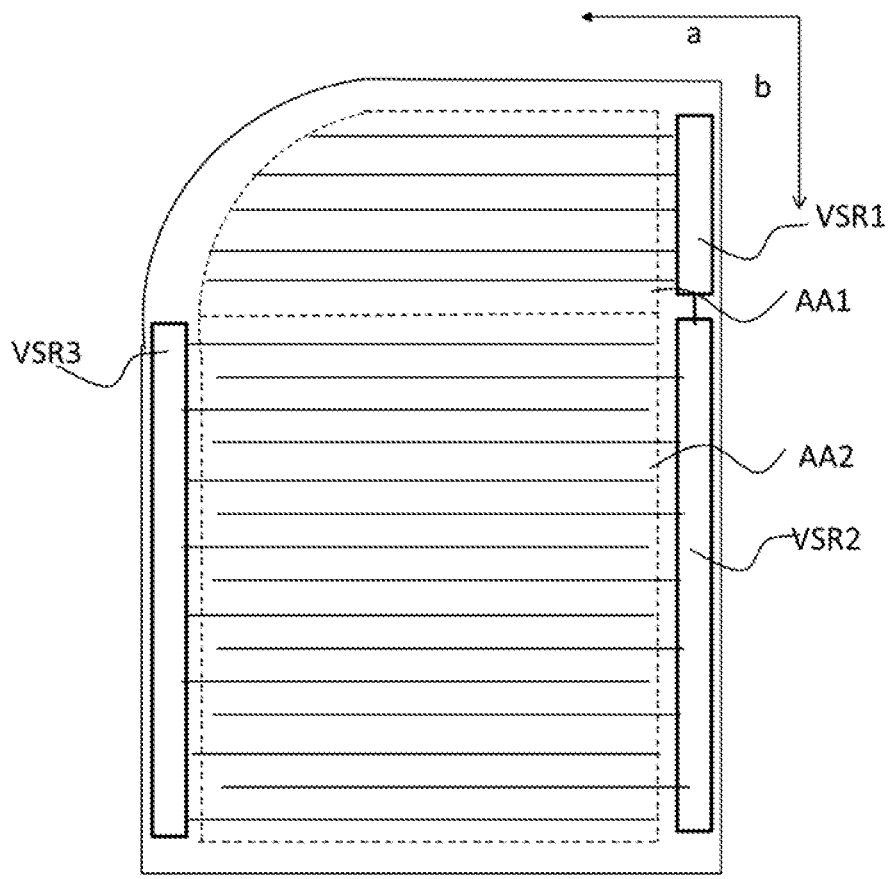
FIG. 29 illustrates a schematic structural diagram of another display panel consistent with disclosed embodiments.

FIG. 29 illustrates a schematic structural diagram of another display panel consistent with disclosed embodiments. In some embodiments, as shown in FIG. 29, a partial area of the upper left corner of a display panel is cut. Accordingly, the display panel has a special-shaped area (i.e., the first area AA1) and a normal area (i.e., the second area AA2) adjacent to each other in the second direction b.

Here, the scan driving circuit of the display panel includes: a first scan driving sub-circuit VSR1 disposed on the right side-frame of the special-shaped area AA1, a second scan driving sub-circuit VSR2 disposed on the right side-frame of the normal area AA2, and a third scan driving sub-circuit VSR3 disposed on the left side-frame of the normal area AA2. The first scan driving sub-circuit VSR1 is cascaded with the second scan driving sub-circuit VSR2. The first scan driving sub-circuit VSR1 performs a progressive scanning on the sub-pixels in the special-shaped area AA1. The second scan driving sub-circuit VSR2 and the third scan driving sub-circuit VSR3 perform an interlaced scanning on the sub-pixels in the normal area AA2.

Figure 30:
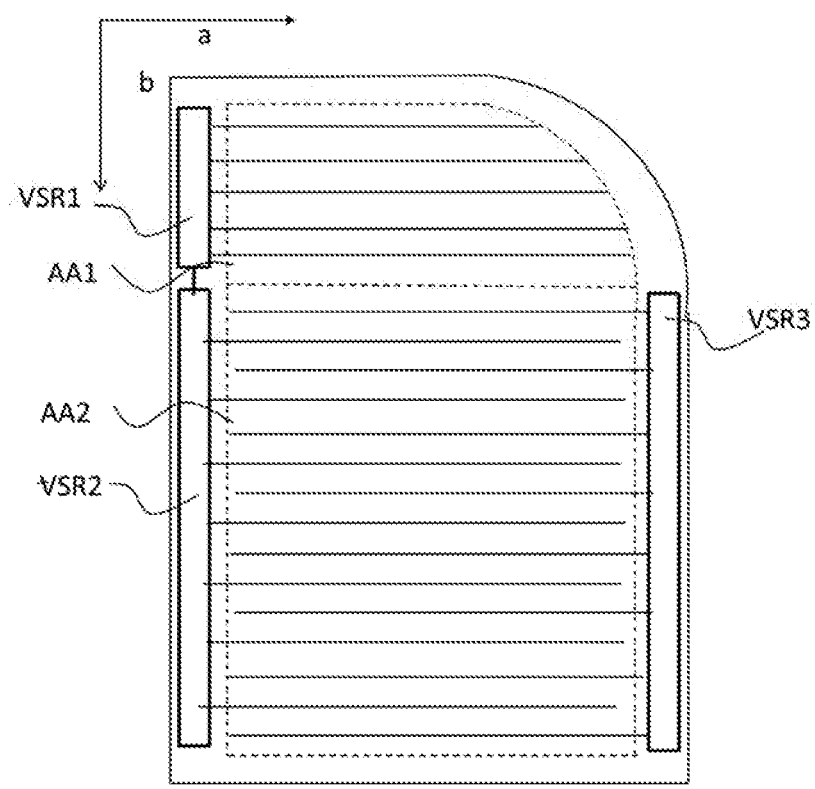
FIG. 30 illustrates a schematic structural diagram of another display panel consistent with disclosed embodiments.

FIG. 30 illustrates a schematic structural diagram of another display panel consistent with disclosed embodiments. In some embodiments, as shown in FIG. 30, a partial area of the upper right corner of a display panel is cut. Accordingly, the display panel has a special-shaped area (i.e., the first area AA1) and a normal area (i.e., the second area AA2) adjacent to each other in the second direction b.

Here, the scan driving circuit of the display panel includes: a first scan driving sub-circuit VSR1 disposed on the left side-frame of the special-shaped area AA1, a second scan driving sub-circuit VSR2 disposed on the left side-frame of the normal area AA2, and a third scan driving sub-circuit VSR3 disposed on the right side-frame of the normal area AA2.

The first scan driving sub-circuit VSR1 is cascaded with the second scan driving sub-circuit VSR2. The first scan driving sub-circuit VSR1 performs a progressive scanning on the sub-pixels in the special-shaped area AA1. The second scan driving sub-circuit VSR2 and the third scan driving sub-circuit VSR3 perform an interlaced scanning on the sub-pixels in the normal area AA2.

Figure 31:
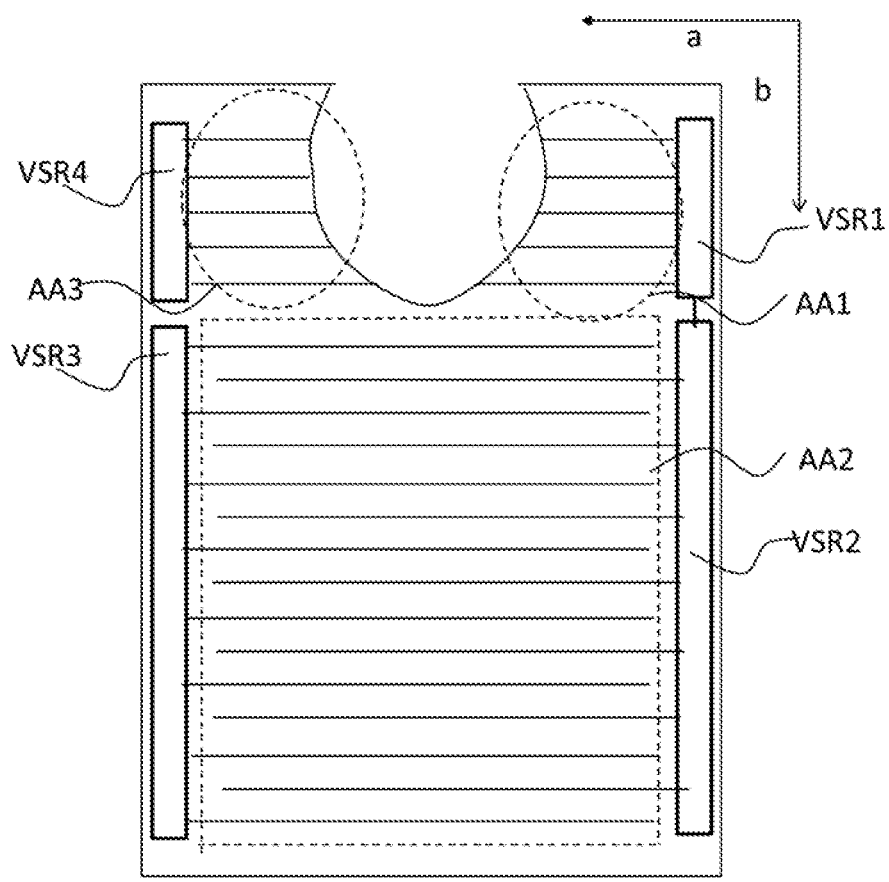
FIG. 31 illustrates a schematic structural diagram of another display panel consistent with disclosed embodiments.

FIG. 31 illustrates a schematic structural diagram of another display panel consistent with disclosed embodiments. In some embodiments, as shown in FIG. 31, an intermediate portion of an edge of an upper portion of a display panel is cut to form a notch, so that the display panel has a special-shaped area and a normal area (namely the second area AA2) adjacently aligned in the second direction b. Here, the special-shaped area includes a first special-shaped area (namely the first area AA1) and a second special-shaped area (namely the third area AA3) that are sequentially aligned in the first direction a. In the first direction, the first special-shaped area AA1 and the second special-shaped area AA3 are respectively located on two sides of the notch.

Here, the scan driving circuit of the display panel includes: a first scan driving sub-circuit VSR1 disposed on the right side-frame of the first special-shaped area AA1, a fourth scan driving sub-circuit VSR4 disposed on the left side-frame of the second special-shaped area AA3, a second scan driving sub-circuit VSR2 disposed on the right side-frame of the normal area AA2, and a third scan driving sub-circuit VSR3 disposed on the left side-frame of the normal area AA2.

The first scan driving sub-circuit VSR1 is cascaded with the second scan driving sub-circuit VSR2, and the fourth scan driving sub-circuit VSR4 is cascaded with the third scan driving sub-circuit VSR3. The first scan driving sub-circuit VSR1 performs a progressive scanning on the sub-pixels in the first special-shaped area AA1, the fourth scan driving sub-circuit VSR4 performs a progressive scanning on the sub-pixels in the second special-shaped area AA3, and the fourth scan driving sub-circuit VSR4 is identical to the first scan driving sub-circuit VSR1. The second scan driving sub-circuit VSR2 and the third scan driving sub-circuit VSR3 perform an interlaced scanning on the sub-pixels in the normal area AA2.

Figure 32:
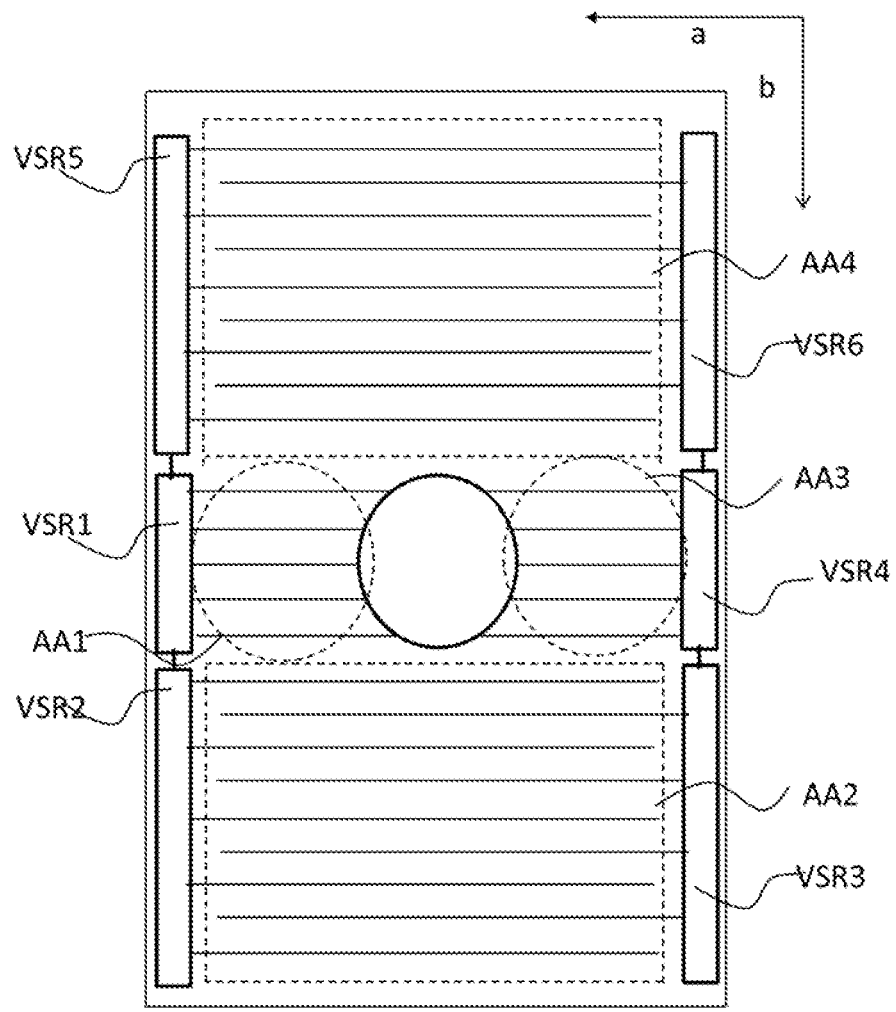
FIG. 32 illustrates a schematic structural diagram of another display panel consistent with disclosed embodiments.

FIG. 32 illustrates a schematic structural diagram of another display panel consistent with disclosed embodiments. In some embodiments, as shown in FIG. 32, a central portion of a display panel is cut to form a hollow portion LQ, so that the display panel has a first normal area AA4, a special-shaped area, and a second normal area (namely the second area AA2) aligned adjacently in the second direction b. Here, the special-shaped area includes a first special-shaped area (namely the first area AA1) and a second special-shaped area (namely the third area AA3) sequentially aligned in the first direction a. The first special-shaped area AA1 and the second special-shaped area AA3 are respectively located on two sides of the hollow portion LQ in the first direction.

Here, the scan driving circuit of the display panel includes: a fifth scan driving sub-circuit VSR5 disposed on the left side-frame of the first normal area AA4, a sixth scan driving sub-circuit VSR6 disposed on the right side-frame of the first normal area AA4, a first scan driving sub-circuit VSR1 disposed on the left side-frame of the first special-shaped area AA1, a fourth scan driving sub-circuit VSR4 disposed on the right side-frame of the second special-shaped area AA3, a second scan driving sub-circuit VSR2 disposed on the left side-frame of the second normal area AA2, and a third scan driving sub-circuit VSR3 disposed on the right side-frame of the second normal area AA2.

The fifth scan driving sub-circuit VSR5 and the first scan driving sub-circuit VSR1 are sequentially cascaded with the second scan driving sub-circuit VSR2. The sixth scan driving sub-circuit VSR6 and the fourth scan driving sub-circuit VSR4 are cascaded with the third scan driving sub-circuit VSR3. The fifth scan driving sub-circuit VSR5 and the sixth scan driving sub-circuit VSR6 perform an interlaced scanning on the sub-pixels in the first normal area AA4. The first scan driving sub-circuit VSR1 performs a progressive scanning on the sub-pixels in the first special-shaped area AA1.

The fourth scan driving sub-circuit VSR4 performs a progressive scanning on the sub-pixels in the second special-shaped area AA3. The second scan driving sub-circuit VSR2 and the third scan driving sub-circuit VSR3 perform an interlaced scanning on the sub-pixels in the second normal area AA2.

The fourth scan driving sub-circuit VSR4 is identical to the first scan driving sub-circuit VSR1. When the first normal area AA4 and the second normal area AA2 are the same size, the fifth scan driving sub-circuit VSR5 is identical to the second scan driving sub-circuit VSR2, and the sixth scan driving sub-circuit VSR6 is identical to the third scan driving sub-circuit VSR3. When the first normal area AA4 is larger than the second normal area AA2, a part of the fifth scan driving sub-circuit VSR5 is identical to the second scan driving sub-circuit VSR2, and a part of the sixth scan driving sub-circuit VSR6 is identical to the third scan driving sub-circuit VSR3. When the first normal area AA4 is smaller than the second normal area AA2, the fifth scan driving sub-circuit VSR5 is identical to a part of the second scan driving sub-circuit VSR2, and the sixth scan driving sub-circuit VSR6 is identical to a part of the third scan driving sub-circuit VSR3.

The foregoing is a description of display panels consistent with the disclosed embodiments. In some embodiments, the present disclosure further provides a display device. The display device may be a mobile phone, a PAD, or a tablet computer, etc., that includes any of the display panels provided by the present disclosure, and may have the performance of these display panels, which will not be described here.

As can be seen from the above embodiments, the display panel and the display device of the present disclosure achieve the following beneficial effects:

A partial area of a display panel is scanned in a progressive scan mode. In this area, the scan driving circuit only needs to be disposed on one side. The remaining area of the display panel is scanned in an interlaced scan mode. For a special-shaped display panel, the special-shaped area is scanned in a progressive scan mode, while the major normal area may still be scanned in an interlaced scan mode. This may simplify the wiring required by an interlaced scan mode for scanning the special-shaped display panel, thereby facilitating the achievement of narrow bezels.

While some embodiments of the present disclosure have been described by references to specific examples, such examples are provided by way of illustration, but not by way of limitation of the scope of the present disclosure. It is to be understood that changes and variations may be made to the above embodiments by those of ordinary skill in the art without departing from the spirit or the scope of the present disclosure, which is set forth in the following claims.

What is claimed is:

1. A display panel, comprising:
a first area and a second area;
a plurality of scan lines disposed in the first area and the second area; and
a scan driving circuit for driving the plurality of scan lines,
wherein:
each of the plurality of scan lines extends in a first direction and is sequentially aligned in a second direction, and the first direction intersects with the second direction;
the scan driving circuit includes a first scan driving sub-circuit, a second scan driving sub-circuit, and a third scan driving sub-circuit, and the first scan driving sub-circuit is cascaded with the second scan driving sub-circuit;
the first area and the second area are adjacent to each other in the second direction, the first scan driving sub-circuit drives scan lines in the first area in a progressive scan mode, and the second scan driving sub-circuit and the third scan driving sub-circuit respectively drive scan lines in the second area in an interlaced scan mode;
each scan driving sub-circuit includes a plurality of shift registers that are sequentially cascaded, each of the plurality of shift registers including an input terminal, an output terminal, and an output signal control terminal, wherein the output terminal is connected to a scan line;
in each scan driving sub-circuit, an input terminal of a first stage shift register of the scan driving sub-circuit receives a start pulse signal of the display panel or connects to an output terminal of a shift register in another scan driving sub-circuit, and an input terminal of each stage shift register from a second stage shift register to an N-th stage shift register is connected to an output terminal of a preceding stage shift register, wherein N is a positive integer greater than one;
in each shift register, after the input terminal receives an active-level signal, a timing at which the output terminal outputs an active-level signal is synchronized with a timing at which the output signal control terminal receives a first active-level signal;
in each scan cycle, if the first area is scanned before the second area, an input terminal of a first stage shift register of the second scan driving sub-circuit is connected to an output terminal of a last stage shift register of the first scan driving sub-circuit, a signal received by an input terminal of the first stage shift register of the third scan driving sub-circuit is the same as a signal outputted by an output terminal of a second-to-last stage shift register of the first scan driving sub-circuit; and
in each scan cycle, if the first area is scanned after the second area, an input terminal of the first stage shift register of the first scan driving sub-circuit is connected to an output terminal of a last stage shift register of the second scan driving circuit, an input terminal of the first stage shift register of the third scan driving sub-circuit receives an active-level signal one moment earlier than an input terminal of the first stage shift register of the second scan driving sub-circuit to receive an active-level signal.

2. The display panel according to claim 1, wherein:
each of the plurality of shift registers further includes a start signal input terminal and a reset signal input terminal;
in a shift register of the first scan driving sub-circuit, there is a one-moment difference sequentially between timings at which the start signal input terminal, the output signal control terminal, and the reset signal input terminal receive an active-level signal; and
in a shift register of the second scan driving sub-circuit and the third scan driving sub-circuit, there is a two-moment difference between timings at which the start signal input terminal and the output signal control terminal receive an active-level signal, and there is a one-moment difference between timings at which the output signal control terminal and the reset signal input terminal receive an active-level signal.

3. The display panel according to claim 2, further comprising a first clock signal line, a second clock signal line, a third clock signal line, and a fourth clock signal line, wherein:

in a scan cycle, the first clock signal line provides a first clock signal, the second clock signal line provides a second clock signal, the third clock signal line provides a third clock signal, and the fourth clock signal line provides a fourth clock signal, and a clock cycle of each clock signal includes four moments;

in each clock cycle, the first clock signal is an active-level signal only at the first moment, the second clock signal is an active-level signal only at the second moment, the third clock signal is an active-level signal only at the third moment, and the fourth clock signal is an active-level signal only at the fourth moment;

in the first scan driving sub-circuit, a start signal input terminal of a 4X+1-th stage shift register is connected to the first clock signal line, an output signal control terminal of the 4X+1-th stage shift register is connected to the second clock signal line, a reset signal input terminal of the 4X+1-th stage shift register is connected to the third clock signal line, a start signal input terminal of a 4X+2-th stage shift register is connected to the second clock signal line, an output signal control terminal of the 4X+2-th stage shift register is connected to the third clock signal line, a reset signal input terminal of the 4X+2-th stage shift register is connected to the fourth clock signal line, a start signal input terminal of a 4X+3-th stage shift register is connected to the third clock signal line, an output signal control terminal of the 4X+3-th stage shift register is connected to the fourth clock signal line, a reset signal input terminal of the 4X+3-th stage shift register is connected to the first clock signal line, a start signal input terminal of a 4X+4-th stage shift register is connected to the fourth clock signal line, an output signal control terminal of the 4X+4-th stage shift register is connected to the first clock signal line, and a reset signal input terminal of the 4X+4-th stage shift register is connected to the second clock signal line, wherein X is greater than or equal to 0;

in the second scan driving sub-circuit, a start signal input terminal of a 2X+1-th stage shift register is connected to the first clock signal line, an output signal control terminal of the 2X+1-th stage shift register is connected to the third clock signal line, a reset signal input terminal of the 2X+1-th stage shift register is connected to the fourth clock signal line, a start signal input terminal of a 2X+2-th stage shift register is connected to the third clock signal line, an output signal control terminal of the 2X+2-th stage shift register is connected to the first clock signal line, and a reset signal input terminal of the 2X+2-th stage shift register is connected to the second clock signal line; and in the third scan driving sub-circuit, the start signal input terminal of a 2X+1-th stage shift register is connected to the second clock signal line, the output signal control terminal of the 2X+1-th stage shift register is connected to the fourth clock signal line, the reset signal input terminal of the 2X+1-th stage shift register is connected to the first clock signal line, the start signal input terminal of a 2X+2-th stage shift register is connected to the fourth clock signal line, the output signal control terminal of the 2X+2-th stage shift register is connected to the second clock signal line, and the reset signal input terminal of the 2X+2-th stage shift register is connected to the third clock signal line.

4. The display panel according to claim 2, further comprising a fifth clock signal line, a sixth clock signal line, a seventh clock signal line, and an eighth clock signal line, wherein:

in a first time period of a scan cycle, the fifth clock signal line provides a fifth clock signal, the sixth clock signal line provides a sixth clock signal, the seventh clock signal line provides a seventh clock signal, and the eighth clock signal line provides an eighth clock signal, a clock cycle of each clock signal includes three moments, the fifth clock signal is an active-level signal only at the first moment, the sixth clock signal is an active-level signal only at the second moment, the seventh clock signal is an active-level signal only at the third moment, and the eighth clock signal continues to be at an inactive-level signal;

in a second time period of the scan cycle, the fifth clock signal line provides a ninth clock signal, the sixth clock signal line provides a tenth clock signal, the seventh clock signal line provides an eleventh clock signal, the eighth clock signal line provides a twelfth clock signal, a clock cycle of each clock signal includes four moments, the ninth clock signal is an active-level signal only at the first moment, the tenth clock signal is an active-level signal only at the second moment, the eleventh clock signal is an active-level signal only at the third moment, and the twelfth clock signal is an active-level signal only at the fourth moment;

in the first scan driving sub-circuit, a start signal input terminal of a 3X+1-th stage shift register is connected to the fifth clock signal line, an output signal control terminal of the 3X+1 -th stage shift register is connected to the sixth clock signal line, a reset signal input terminal of the 3X+1-th stage shift register is connected to the seventh clock signal line, a start signal input terminal of a 3X+2-th stage shift register is connected to the sixth clock signal line, an output signal control terminal of the 3X+2-th stage shift register is connected to the seventh clock signal line, a reset signal input terminal of the 3X+2-th stage shift register is connected to the fifth clock signal line, a start signal input terminal of a 3X+3-th stage shift register is connected to the seventh clock signal line, an output signal control terminal of the 3X+3-th stage shift register is connected to the fifth clock signal line, and a reset signal input terminal of the 3X+3-th stage shift register is connected to the sixth clock signal line, wherein X is greater than or equal to 0;

in the second scan driving sub-circuit, a start signal input terminal of a 2X+1-th stage shift register is connected to the fifth clock signal line, an output signal control terminal of the 2X+1-th stage shift register is connected to the seventh clock signal line, a reset signal input terminal of the 2X+1-th stage shift register is connected to the eighth clock signal line, a start signal input terminal of a 2X+2-th stage shift register is connected to the seventh clock signal line, an output signal control terminal of the 2X+2-th stage shift register is connected to the fifth clock signal line, and a reset signal input terminal of the 2X+2-th stage shift register is connected to the sixth clock signal line; and in the third scan driving sub-circuit, the start signal input terminal of a 2X+1-th stage shift register is connected to the sixth clock signal line, the output signal control terminal of the 2X+1-th stage shift register is connected to the eighth clock signal line, the reset signal input terminal of the 2X+1-th stage shift register is connected to the fifth clock signal line, the start signal input terminal of a 2X+2-th stage shift register is connected to the eighth clock signal line, the output signal control terminal of the 2X+2-th stage shift register is connected to the sixth clock signal line, and the reset signal input terminal of the 2X+2-th stage shift register is connected to the seventh clock signal line.

5. The display panel according to claim 2, wherein each of the plurality of shift registers further includes a negative voltage input terminal, a positive voltage input terminal, nine N-type transistors, and two capacitors, wherein:

a first terminal of a first transistor is connected to a first terminal of a second transistor, a second terminal of the first transistor is connected to the negative voltage input terminal, and a control terminal of the first transistor is connected to a control terminal of a fifth transistor, wherein a first node is disposed between the first terminal of the first transistor and the first terminal of the second transistor, a second node, a third node, a fourth node, and a fifth node are sequentially disposed between the second terminal of the first transistor and the negative voltage input terminal, and a sixth node, a seventh node, and an eighth node are sequentially disposed between the control terminal of the first transistor and the control terminal of the fifth transistor;

a second terminal of the second transistor is connected to the input terminal, and a control terminal of the second transistor is connected to the start signal input terminal, wherein a ninth node is disposed between the second terminal of the second transistor and a first terminal of the input terminal;

a first terminal of a third transistor is connected to the third node, and a second terminal of the third transistor is connected to the seventh node;

a first terminal of a fourth transistor is connected to the seventh node, a second terminal of the fourth transistor is connected to the positive voltage input terminal, and a control terminal of the fourth transistor is connected to a control terminal of a ninth transistor, wherein the fourth node is disposed between the second terminal of the fourth transistor and the positive voltage input terminal, and an eleventh node is disposed between the control terminal of the fourth transistor and the control terminal of the ninth transistor, and the eleventh node is connected to the reset signal input terminal;

a first terminal of a fifth transistor is connected to the fifth node, a second terminal of the fifth transistor is connected to a first terminal of a sixth transistor, wherein a twelfth node is disposed between the second terminal of the fifth transistor and the first terminal of the sixth transistor, and the twelfth node is connected the output terminal;

a second terminal of the sixth transistor is connected to the output signal control terminal;

a first terminal of a seventh transistor is connected to the first node, a control terminal of the seventh transistor is connected to a tenth node, wherein a thirteenth node and a fourteenth node are sequentially disposed between the first terminal of the seventh transistor and the first node, and the thirteenth node is connected to a control terminal of the third transistor;

a first terminal of an eighth transistor is connected to the second node, and a second terminal of the eighth transistor is connected to the sixth node;

a first terminal of a ninth transistor is connected to the fourteenth node, a second terminal of the ninth transistor is connected to the ninth node, wherein a fifteenth node is disposed between the second terminal of the ninth transistor and the ninth node, and the fifteenth node is connected to a control terminal of the eighth transistor;

a first terminal of a first capacitor is connected to the fourth node, and a second terminal of the first capacitor is connected to the eighth node; and a first terminal of a second capacitor is connected to the twelfth node, and a second terminal of the second capacitor is connected to a second terminal of the seventh transistor, wherein a sixteenth node is disposed between the second terminal of the second capacitor and the second terminal of the seventh transistor, and the sixteenth node is connected to a control terminal of the sixth transistor.

6. The display panel according to claim 1, wherein:

the scan driving circuit further includes a fourth scan driving sub-circuit, and the fourth scan driving sub-circuit is cascaded with the third scan driving sub-circuit; and the display panel has a notch and a third area, the first area and the third area are respectively located on two sides of the notch in the first direction, and the third area is adjacent to the second area in the second direction, wherein the fourth scan driving sub-circuit drives scan lines in the third area in a progressive scan mode.

7. The display panel according to claim 6, wherein:

in the first direction, the first scan driving sub-circuit, the second scan driving sub-circuit, and the first area are disposed on a first side of the notch, and the fourth scan driving sub-circuit, the third scan driving sub-circuit, and the third area are disposed on a second side of the notch.

8. A display device, comprising:

a signal-generating component for generating a signal; and a display panel for displaying the signal, wherein the display panel includes:

a first area and a second area;

a plurality of scan lines disposed in the first area and the second area; and a scan driving circuit for driving the plurality of scan lines, wherein:

each of the plurality of scan lines extends in a first direction and is sequentially aligned in a second direction, and the first direction intersects with the second direction, the scan driving circuit includes a first scan driving sub-circuit, a second scan driving sub-circuit, and a third scan driving sub-circuit, and the first scan driving sub-circuit is cascaded with the second scan driving sub-circuit, and the first area and the second area are adjacent to each other in the second direction, the first scan driving sub-circuit drives scan lines in the first area in a progressive scan mode, and the second scan driving sub-circuit and the third scan driving sub-circuit respectively drive scan lines in the second area in an interlaced scan mode, each scan driving sub-circuit includes a plurality of shift registers that are sequentially cascaded, each of the plurality of shift registers including an input terminal, an output terminal, and an output signal control terminal, wherein the output terminal is connected to a scan line;

in each scan driving sub-circuit, an input terminal of a first stage shift register of the scan driving sub-circuit receives a start pulse signal of the display panel or connects to an output terminal of a shift register in another scan driving sub-circuit, and an input terminal of each stage shift register from a second stage shift register to an N-th stage shift register is connected to an output terminal of a preceding stage shift register, wherein N is a positive integer greater than one;

in each shift register, after the input terminal receives an active-level signal, a timing at which the output terminal outputs an active-level signal is synchronized with a timing at which the output signal control terminal receives a first active-level signal;

in each scan cycle, if the first area is scanned before the second area, an input terminal of a first stage shift register of the second scan driving sub-circuit is connected to an output terminal of a last stage shift register of the first scan driving sub-circuit, a signal received by an input terminal of the first stage shift register of the third scan driving sub-circuit is the same as a signal outputted by an output terminal of a second-to-last stage shift register of the first scan driving sub-circuit; and in each scan cycle, if the first area is scanned after the second area, an input terminal of the first stage shift register of the first scan driving sub-circuit is connected to an output terminal of a last stage shift register of the second scan driving circuit, an input terminal of the first stage shift register of the third scan driving sub-circuit receives an active-level signal one moment earlier than an input terminal of the first stage shift register of the second scan driving sub-circuit to receive an active-level signal.

9. The display device according to claim 8, wherein:

each of the plurality of shift registers further includes a start signal input terminal and a reset signal input terminal;

in a shift register of the first scan driving sub-circuit, there is a one-moment difference sequentially between timings at which the start signal input terminal, the output signal control terminal, and the reset signal input terminal receive an active-level signal; and in a shift register of the second scan driving sub-circuit and the third scan driving sub-circuit, there is a two-moment difference between timings at which the start signal input terminal and the output signal control terminal receive an active-level signal, and there is a one-moment difference between timings at which the output signal control terminal and the reset signal input terminal receive an active-level signal.

* * * * *